*US008963611B2*

United States Patent
See et al.

(10) Patent No.: US 8,963,611 B2
(45) Date of Patent: Feb. 24, 2015

(54) POWER AND IMPEDANCE MEASUREMENT CIRCUITS FOR A WIRELESS COMMUNICATION DEVICE

(75) Inventors: Puay Hoe See, San Diego, CA (US);
Gary J. Ballantyne, Christchurch (NZ);
Gurkanwal Singh Sahota, San Diego, CA (US); Aristotele Hadjichristos, Cary, NC (US); Alberto Cicalini, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 460 days.

(21) Appl. No.: 12/580,988

(22) Filed: Oct. 16, 2009

(65) Prior Publication Data
US 2010/0321086 A1 Dec. 23, 2010

Related U.S. Application Data

(60) Provisional application No. 61/218,836, filed on Jun. 19, 2009.

(51) Int. Cl.
*G06G 7/16* (2006.01)
(52) U.S. Cl.
USPC .......................................... 327/359; 333/17.3
(58) Field of Classification Search
USPC .............. 327/359; 324/709; 333/32–33, 17.3; 375/36, 257; 379/398, 36, 340, 379/402–404, 394; 455/123, 125, 129, 289
See application file for complete search history.

(56) References Cited

U.S. PATENT DOCUMENTS

| | | | |
|---|---|---|---|
| 4,015,223 A * | 3/1977 | Cheze | 333/17.3 |
| 4,263,653 A | 4/1981 | Mecklenburg | |
| 4,375,051 A * | 2/1983 | Theall | 333/17.3 |
| 4,493,112 A * | 1/1985 | Bruene | 455/123 |

(Continued)

FOREIGN PATENT DOCUMENTS

| | | |
|---|---|---|
| CN | 1282140 A | 1/2001 |
| CN | 1367952 A | 9/2002 |

(Continued)

OTHER PUBLICATIONS van Bezooijen, A. et al., "Adaptive Impedance-Matching Techniques for Controlling L Networks", Circuits and Systems I: Regular Papers, IEEE Transactions on; vol. 57 , Issue: 2; Digital Object Identifier: 10.1109/TCSI.2009.2023764 Feb. 2010, pp. 495-505.

(Continued)

*Primary Examiner* — Kenneth B. Wells
(74) *Attorney, Agent, or Firm* — James Gutierrez

(57) ABSTRACT

Exemplary embodiments disclosed are directed to power and impedance measurement circuits that may be used to measure power and/or impedance are described. A measurement circuit may include a sensor and a computation unit. The sensor may sense (i) a first voltage signal across a series circuit coupled to a load to obtain a first sensed signal and (ii) a second voltage signal at a designated end of the series circuit to obtain a second sensed signal. The sensor may mix (i) a first version of the first sensed signal with a first version of the second sensed signal to obtain a first sensor output and (ii) a second version of the first sensed signal with a second version of the second sensed signal to obtain a second sensor output. The computation unit may determine the impedance and/or delivered power at the designated end of the series circuit based on the sensor outputs.

13 Claims, 15 Drawing Sheets

(56) References Cited

U.S. PATENT DOCUMENTS

| | | |
|---|---|---|
| 4,559,503 A | 12/1985 | Camand et al. |
| 4,612,669 A * | 9/1986 | Nossen .................. 455/123 |
| 5,023,688 A | 6/1991 | Ando et al. |
| 5,208,537 A * | 5/1993 | Rietsch et al. ............ 324/322 |
| 5,300,068 A | 4/1994 | Rosar et al. |
| 5,361,403 A | 11/1994 | Dent |
| 5,483,680 A * | 1/1996 | Talbot ..................... 455/107 |
| 5,530,923 A | 6/1996 | Heinonen et al. |
| 5,541,554 A | 7/1996 | Stengel et al. |
| 5,564,086 A | 10/1996 | Cygan et al. |
| 5,673,287 A | 9/1997 | Colvis et al. |
| 5,774,017 A | 6/1998 | Adar |
| 5,778,308 A * | 7/1998 | Sroka et al. ............. 455/115.1 |
| 5,969,582 A | 10/1999 | Boesch et al. |
| 5,973,557 A | 10/1999 | Miyaji et al. |
| 5,978,192 A | 11/1999 | Young et al. |
| 6,020,794 A * | 2/2000 | Wilbur .................... 333/17.1 |
| 6,166,598 A | 12/2000 | Schlueter |
| 6,188,877 B1 | 2/2001 | Boesch et al. |
| 6,215,359 B1 | 4/2001 | Peckham et al. |
| 6,317,608 B1 | 11/2001 | Glocker |
| 6,362,690 B1 * | 3/2002 | Tichauer ................. 330/298 |
| 6,370,364 B1 | 4/2002 | Liimatainen |
| 6,389,269 B1 | 5/2002 | Nanni et al. |
| 6,414,562 B1 | 7/2002 | Bouisse et al. |
| 6,441,768 B2 | 8/2002 | Cho et al. |
| 6,570,462 B2 * | 5/2003 | Edmonson et al. ......... 333/17.3 |
| 6,603,351 B2 | 8/2003 | Suzuki |
| 6,606,483 B1 | 8/2003 | Baker et al. |
| 6,759,916 B2 | 7/2004 | Ishizaki et al. |
| 6,771,130 B2 | 8/2004 | Hasegawa et al. |
| 6,859,104 B2 | 2/2005 | Toncich et al. |
| 6,865,399 B2 | 3/2005 | Fujioka et al. |
| 6,946,847 B2 * | 9/2005 | Nishimori et al. ............ 324/600 |
| 6,950,637 B2 | 9/2005 | Kim |
| 6,992,543 B2 | 1/2006 | Luetzelschwab et al. |
| 7,009,455 B2 | 3/2006 | Toncich et al. |
| 7,010,073 B2 | 3/2006 | Black et al. |
| 7,126,386 B2 | 10/2006 | Tumer et al. |
| 7,151,411 B2 | 12/2006 | Martin et al. |
| 7,176,634 B2 * | 2/2007 | Kitamura et al. ........ 315/111.21 |
| 7,187,231 B2 | 3/2007 | McGrath et al. |
| 7,215,933 B1 | 5/2007 | Tse et al. |
| 7,417,508 B1 | 8/2008 | Quaglietta |
| 7,443,236 B2 | 10/2008 | Dow et al. |
| 7,509,100 B2 | 3/2009 | Toncich |
| 7,512,386 B2 | 3/2009 | Kalajo et al. |
| 7,567,782 B2 | 7/2009 | Liu et al. |
| 7,580,684 B2 | 8/2009 | Cyr et al. |
| 7,616,054 B2 | 11/2009 | Jeon et al. |
| 7,764,125 B2 | 7/2010 | Dawe |
| 7,782,134 B2 | 8/2010 | Drogi et al. |
| 7,868,699 B2 | 1/2011 | Ono et al. |
| 7,893,763 B2 | 2/2011 | Andrews |
| 7,893,769 B2 | 2/2011 | Asano |
| 7,911,277 B2 | 3/2011 | Paul et al. |
| 7,917,170 B2 | 3/2011 | Zhitnitsky |
| 8,000,737 B2 | 8/2011 | Caimi et al. |
| 8,072,272 B2 | 12/2011 | Zhao et al. |
| 8,111,111 B2 * | 2/2012 | Van Bezooijen ............. 333/17.3 |
| 8,131,232 B2 * | 3/2012 | Muhammad .............. 455/114.2 |
| 8,140,033 B2 * | 3/2012 | Chan Wai Po et al. .... 455/115.1 |
| 8,213,886 B2 * | 7/2012 | Blin .............................. 455/123 |
| 8,280,323 B2 | 10/2012 | Thompson |
| 8,306,490 B2 | 11/2012 | Tanoue et al. |
| 8,330,475 B2 * | 12/2012 | Van Bezooijen et al. ..... 324/709 |
| 8,368,470 B2 | 2/2013 | Alidio et al. |
| 2002/0094037 A1 | 7/2002 | Darabi et al. |
| 2003/0060227 A1 | 3/2003 | Sekine et al. |
| 2003/0193997 A1 | 10/2003 | Dent et al. |
| 2004/0132441 A1 | 7/2004 | Livet et al. |
| 2004/0224649 A1 | 11/2004 | Shamsaifar |
| 2005/0159119 A1 | 7/2005 | Kataoka et al. |
| 2005/0221855 A1 | 10/2005 | Kuriyama et al. |
| 2005/0225388 A1 | 10/2005 | Ramachandran et al. |
| 2005/0227640 A1 | 10/2005 | Haque et al. |
| 2006/0028301 A1 | 2/2006 | Kamata et al. |
| 2006/0053321 A1 | 3/2006 | Mizusawa |
| 2006/0160501 A1 | 7/2006 | Mendolia et al. |
| 2006/0164162 A1 | 7/2006 | Dauphinee et al. |
| 2006/0166664 A1 | 7/2006 | Livet et al. |
| 2006/0261895 A1 | 11/2006 | Kocaman et al. |
| 2007/0109698 A1 | 5/2007 | Kim |
| 2007/0197180 A1 * | 8/2007 | McKinzie et al. ......... 455/248.1 |
| 2007/0218844 A1 | 9/2007 | Alanen et al. |
| 2007/0222523 A1 | 9/2007 | Arell |
| 2007/0291173 A1 | 12/2007 | Hsin |
| 2008/0242237 A1 | 10/2008 | Rofougaran et al. |
| 2008/0266021 A1 | 10/2008 | Van Bezooijen et al. |
| 2008/0284539 A1 | 11/2008 | Tateoka et al. |
| 2009/0002077 A1 | 1/2009 | Rohani et al. |
| 2009/0135536 A1 | 5/2009 | Kappes et al. |
| 2009/0318093 A1 | 12/2009 | Prikhodko et al. |
| 2010/0081410 A1 | 4/2010 | Kaido et al. |
| 2010/0308933 A1 | 12/2010 | See et al. |
| 2011/0018632 A1 | 1/2011 | Pletcher et al. |
| 2011/0043956 A1 | 2/2011 | Su et al. |
| 2011/0316636 A1 | 12/2011 | Zhao et al. |
| 2012/0112834 A1 | 5/2012 | Van Bezooijen |

FOREIGN PATENT DOCUMENTS

| | | |
|---|---|---|
| CN | 1677848 A | 10/2005 |
| CN | 1826727 A | 8/2006 |
| CN | 1870423 A | 11/2006 |
| CN | 101095285 A | 12/2007 |
| CN | 101432973 A | 5/2009 |
| CN | 101502004 A | 8/2009 |
| EP | 0982852 A2 | 3/2000 |
| EP | 1727279 A1 | 11/2006 |
| EP | 1916772 A1 | 4/2008 |
| GB | 2356093 A | 5/2001 |
| JP | S62262508 A | 11/1987 |
| JP | S6361812 U | 4/1988 |
| JP | H02161769 A | 6/1990 |
| JP | H03128336 U | 12/1991 |
| JP | H04207521 A | 7/1992 |
| JP | H04368022 A | 12/1992 |
| JP | H07263986 A | 10/1995 |
| JP | H08167819 A | 6/1996 |
| JP | 11055047 A | 2/1999 |
| JP | H11251928 A | 9/1999 |
| JP | 2000150779 A | 5/2000 |
| JP | 2000512460 A | 9/2000 |
| JP | 2001068941 A | 3/2001 |
| JP | 3192907 B2 | 7/2001 |
| JP | 2002535860 A | 10/2002 |
| JP | 2003504929 A | 2/2003 |
| JP | 2003087129 A | 3/2003 |
| JP | 2003516083 A | 5/2003 |
| JP | 2003174367 A | 6/2003 |
| JP | 2004085446 A | 3/2004 |
| JP | 2005045440 A | 2/2005 |
| JP | 2005128721 A | 5/2005 |
| JP | 2005210316 A | 8/2005 |
| JP | 2005524325 A | 8/2005 |
| JP | 2005268895 A | 9/2005 |
| JP | 2005294894 A | 10/2005 |
| JP | 2006074595 A | 3/2006 |
| JP | 2006279190 A | 10/2006 |
| JP | 2007013790 A | 1/2007 |
| JP | 2007503167 A | 2/2007 |
| JP | 2007060455 A | 3/2007 |
| JP | 2007081593 A | 3/2007 |
| JP | 2007104355 A | 4/2007 |
| JP | 2007531470 A | 11/2007 |
| JP | 2008516508 A | 5/2008 |
| JP | 2008521318 A | 6/2008 |
| JP | 2008521319 A | 6/2008 |
| JP | 2008219758 A | 9/2008 |
| JP | 2008288769 A | 11/2008 |
| JP | 2010081383 A | 4/2010 |
| WO | 9748183 A1 | 12/1997 |
| WO | 0042585 A1 | 7/2000 |

(56) References Cited

FOREIGN PATENT DOCUMENTS

| WO | WO0105028 | | 1/2001 |
|----|-----------|---|--------|
| WO | 0141306 | A1 | 6/2001 |
| WO | 03094345 | A2 | 11/2003 |
| WO | WO2004034569 | | 4/2004 |
| WO | 2005006832 | A2 | 1/2005 |
| WO | 2005020433 | A2 | 3/2005 |
| WO | 2005101649 | A2 | 10/2005 |
| WO | 2005101678 | A2 | 10/2005 |
| WO | WO 2006038167 | A1 * | 4/2006 |
| WO | WO2006038167 | A1 | 4/2006 |
| WO | 2006054245 | A1 | 5/2006 |
| WO | WO2006054246 | A1 | 5/2006 |
| WO | WO 2006054246 | A1 * | 5/2006 |
| WO | 2007107633 | A1 | 9/2007 |
| WO | 2008014029 | A2 | 1/2008 |
| WO | 2008114455 | A1 | 9/2008 |

OTHER PUBLICATIONS

International Search Report and Written Opinion—PCT/US2010/039376—International Search Authority, European Patent Office,Dec. 23, 2010.

Adar, A. et al., "A High Efficiency Single Chain GaAs MESFET MMIC Dual Band Power Amplifier for GSM/DCS Handsets", Gallium Arsenide Integrated Circuit (GaAs IC) Symposium, 1998. Technical Digest 1998., 20th Annual; Digital Object Identifier: 10.1109/GAAS.1998.722629; Publication Year: 1998, pp. 69-72.

Bezooijen A, et al., "Power Amplifier Protection by Adaptive Output Power Control", IEEE JSSC, vol. 42, No. 9, Sep. 2007, pp. 1834-1841.

Carrara F, et al., "A Methodology for Fast VSWR Protection Implemented in A Monolithic 3-W 55% PAE RF CMOS Power Amplifier", IEEE JSSC, vol. 43, No. 9, Sep. 2008, pp. 2057-2066.

Chowdhury D et al., "A single-chip highly linear 2.4GHz 30dBm power amplifier in 90nm CMOS", Solid-State Circuits Conference—Digest of Technical Papers, 2009, ISSCC 2009, IEEE International, IEEE, Piscataway, NJ, USA, Feb. 8, 2009, pp. 378-379,379A, XP031466144, ISBN, 978-1-4244-3458-9.

Minsik Ahn, et al., "A Novel Multi-Stack Device Structure and its Analysis for High Power CMOS Switch Design", Microwave Symposium, 2007. IEEE/MTT-S International, IEEE, PI, Jun. 1, 2007, pp. 1393-1396, XP031112198, ISBN, 978-1-4244-0687-6.

Sanielevici S A, et al., "A 900-MHz Transceiver Chipset for Two-Way Paging Applications", IEEE JSSC, vol. 33, No. 12, Dec. 1998, pp. 2160-2168.

Scuderi A, et al., "A VSWR-Protected Silicon Bipolar RF Power Amplifiers with Soft-Slope Power Control", IEEE Jssc, vol. 40, No. 3, Mar. 2005, pp. 611-621.

Su D, et al., "An IC for Linearizing RF Power Amplifiers Using Envelope Elimination and Restoration", IEEE JSSC, vol. 33, No. 12, Dec. 1998, pp. 2252-2258.

Tongqiang Gao, et al., "A novel CMOS transmitter front-end for mobile RFID reader", Radio Frequency Integrated Circuits Symposium, 2009. RFIC 2009. IEEE, IEEE, Piscataway, NJ, USA, Jun. 7, 2009, pp. 105-108, XP031480236, ISBN, 978-1-4244-3377-3.

Vaha-Heikkila T. et al., "A 20-50 Ghz Reconfigurable Match Network for Power Amplifier Applications", Microwave Symposium Digest, 2004 IEEE MTT-S International; vol. 2 Digital Object Identifier: 10.1109/MWSYM.2004.1339059; Publication Year: 2004, pp. 717-720 vol. 2.

Wang et al., "A Nonlinear Capacitance Cancellation Technique and its Application to a CMOS Class AB Power Amplifier," 2001, IEEE Radio Frequency Integrated Circuits Symposium, May 20, 2001, pp. 39-42, XP010551317.

Yao-Jen Chuang, et al., "A novel bubble tolerant thermometer-to-binary encoder for flash A/D converter", VLSI Design, Automation and Test, 2005. (VLSI-TSA-DAT). 2005 IEEE VLSI 20050427; 20050427-20050429 Piscataway, NJ, USA,IEEE, US, Apr. 27, 2005, pp. 315-318, XP010829593, DOI: DOI:10.1109/VDAT.2005.1500084 ISBN: 978-0-7803-9060-7 the whole document.

* cited by examiner

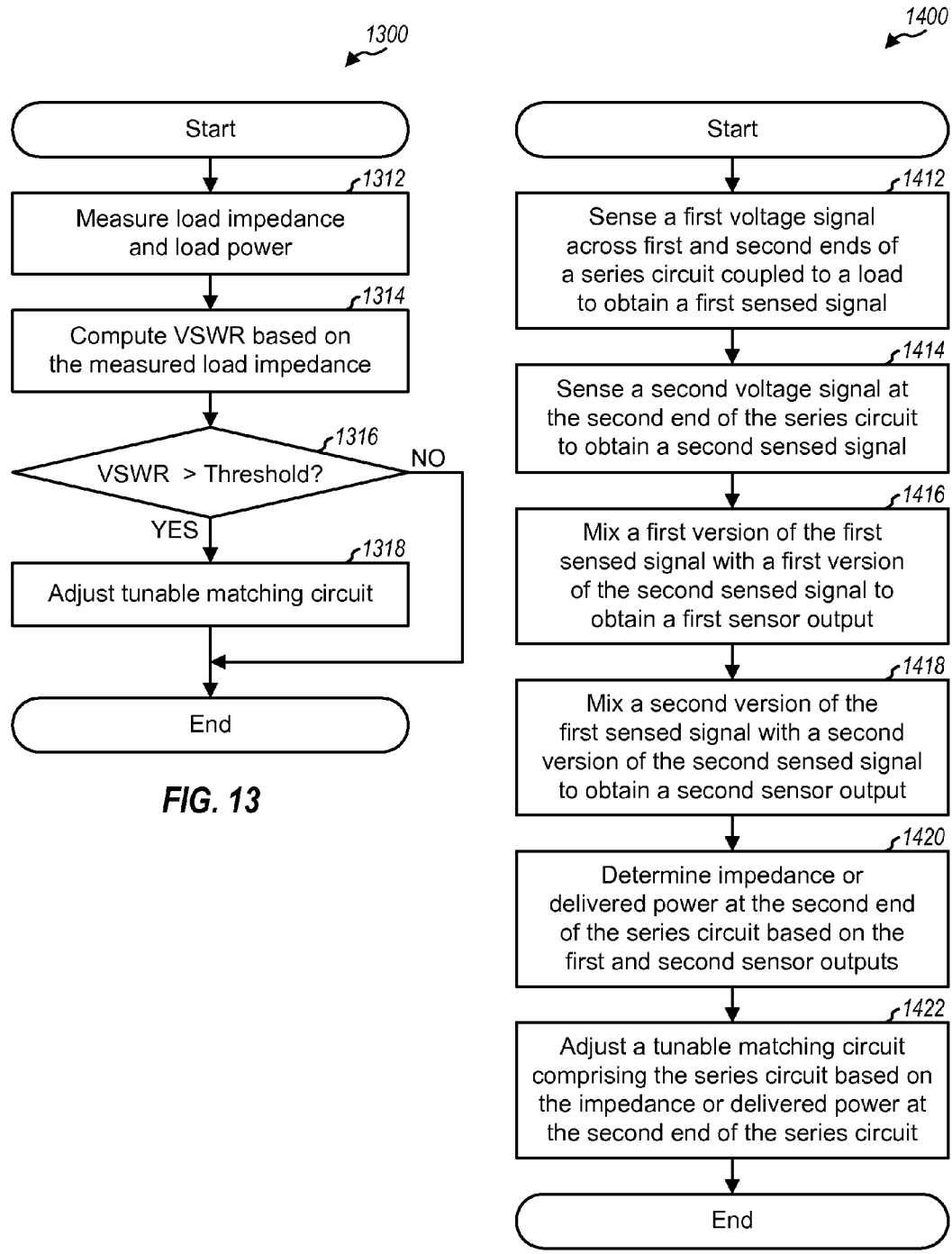

POWER AND IMPEDANCE MEASUREMENT CIRCUITS FOR A WIRELESS COMMUNICATION DEVICE

CLAIM OF PRIORITY UNDER 35 U.S.C. §119

The present Application for Patent claims priority to Provisional U.S. Application Ser. No. 61/218,836, entitled "POWER AND/OR IMPEDANCE MEASUREMENT CIRCUITS FOR A WIRELESS COMMUNICATION DEVICE," filed Jun. 19, 2009 assigned to the assignee hereof, and expressly incorporated herein by reference.

BACKGROUND

I. Field

The present disclosure relates generally to electronics, and more specifically to measurement circuits for a wireless communication device.

II. Background

A wireless communication device typically includes a transmitter to support data transmission. The transmitter may have a power amplifier to amplify a radio frequency (RF) signal and provide high output power. The power amplifier may be designed to drive a particular load impedance (e.g., 50 Ohms) and to have the best possible efficiency at a maximum output power level. The power amplifier may observe a variable load impedance, which may change due to various reasons described below. Furthermore, the power amplifier may operate over a wide range of output power levels, and the efficiency of the power amplifier may decrease at lower output power levels. It may be desirable to improve the operation of the power amplifier.

BRIEF DESCRIPTION OF THE DRAWINGS

FIG. 13 shows a process for performing adaptive load matching.

FIG. 14 shows a process for measuring impedance and/or power.

DETAILED DESCRIPTION

The word "exemplary" is used herein to mean "serving as an example, instance, or illustration." Any design described herein as "exemplary" is not necessarily to be construed as preferred or advantageous over other designs.

Power and impedance measurement circuits that may be used to measure power and/or impedance are described herein. These measurement circuits may be used for various electronics devices such as wireless communication devices, cellular phones, personal digital assistants (PDAs), handheld devices, wireless modems, laptop computers, cordless phones, Bluetooth devices, consumer electronics devices, etc. For clarity, the use of the measurement circuits in a wireless communication device is described below.

Figure 1:
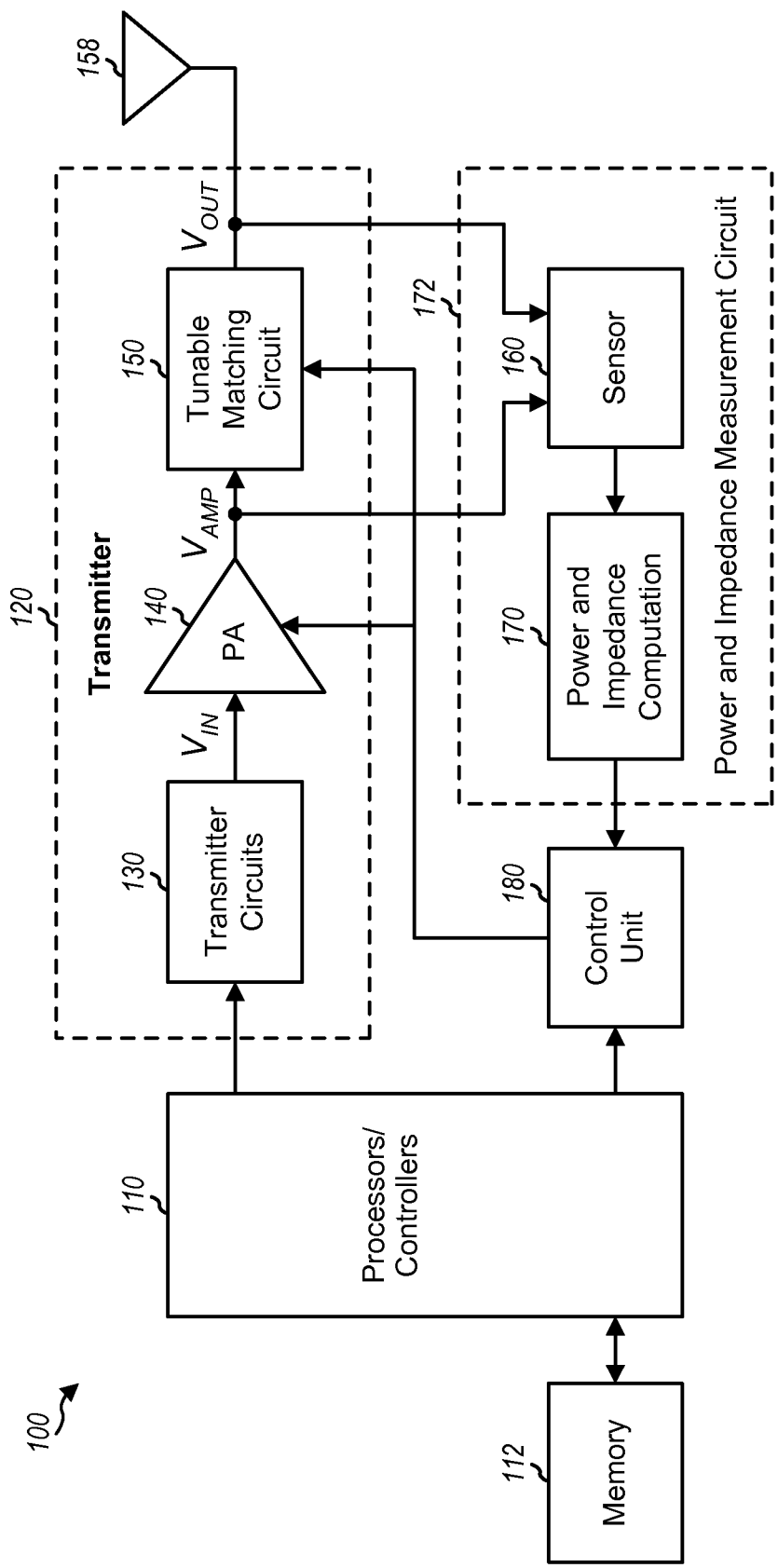
FIG. 1 shows a block diagram of a wireless communication device.

FIG. 1 shows a simplified block diagram of an exemplary design of a wireless communication device 100, which includes a single transmitter 120. In general, wireless device 100 may include any number of transmitters and any number of receivers for any number of communication systems and any number of frequency bands.

Within wireless device 100, processors 110 process data to be transmitted and provide an analog output signal to transmitter 120. Within transmitter 120, transmitter circuits 130 amplify, filter, and upconvert the analog output signal and provide an input RF signal, $V_{IN}$. A power amplifier 140 amplifies the input RF signal to obtain the desired output power level and provides an amplified RF signal, $V_{AMP}$. A tunable matching circuit 150 is coupled to the output of power amplifier 140, performs output impedance matching for power amplifier 140, and provides an output RF signal, $V_{OUT}$, to an antenna 158.

A sensor 160 receives the amplified RF signal from power amplifier 140 and the output RF signal from tunable matching circuit 150. Sensor 160 may measure the voltage, current, power and/or other parameters of the amplified RF signal and/or the output RF signal. A computation unit 170 receives the measurements from sensor 160 and determines the power and/or impedance of a load observed by matching circuit 150. Sensor 160 and computation unit 170 collectively form a power and impedance measurement circuit 172 for wireless device 100. A control unit 180 may receive an envelope signal for the input RF signal, information indicative of an average output power level, and/or information for other parameters affecting the operation of power amplifier 140. Control unit 180 may also receive the measured power and/or impedance from computation unit 170. Control unit 180 may generate a first control to adjust tunable matching circuit 150 to achieve good performance, e.g., to improve the efficiency of power amplifier 140. Control unit 180 may also generate a second control to adjust power amplifier 140 to achieve good performance.

FIG. 1 shows an exemplary design of transmitter 120. In general, the conditioning of the signals in transmitter 120 may be performed by one or more stages of amplifier, filter, mixer, matching circuit, etc. All or a portion of transmitter 120 and possibly sensor 160 may be implemented on an analog integrated circuit (IC), an RF IC (RFIC), a mixed-signal IC, etc.

Processors/controllers 110 may perform various functions for wireless device 100, e.g., processing for data being transmitted. Processors/controllers 110 may also control the operation of various circuits within wireless device 100. Memory 112 may store program codes and data for processors/controllers 110. Processors/controllers 110, memory 112, computation unit 170, and control unit 180 may be implemented on one or more application specific integrated circuits (ASICs) and/or other ICs.

Figure 2:
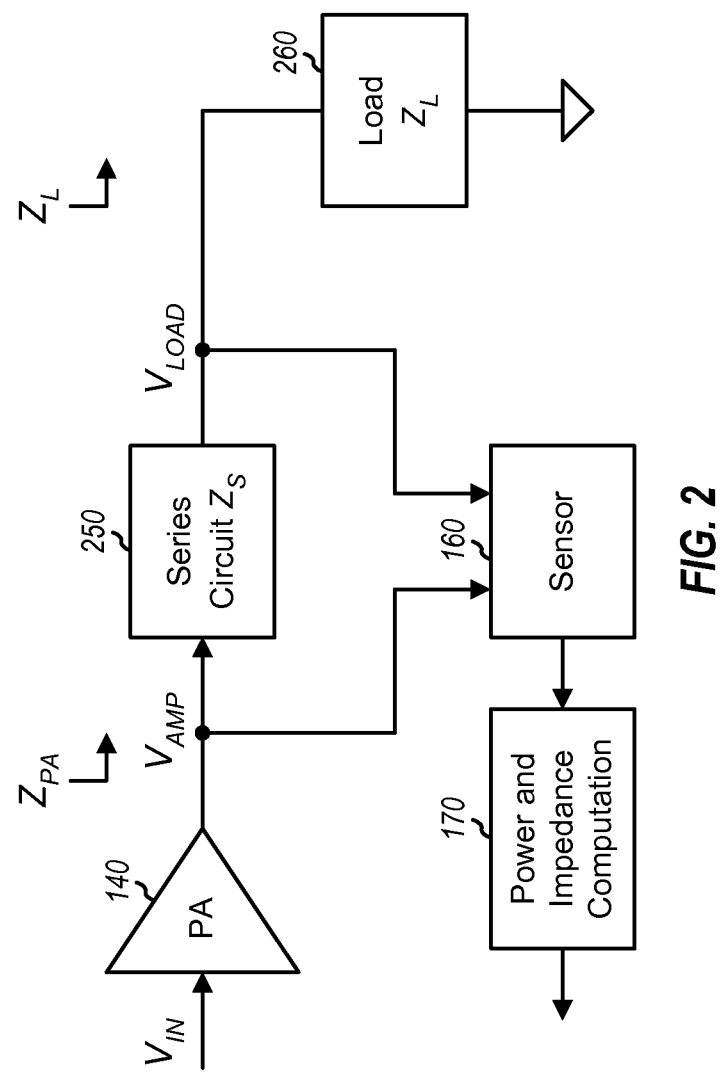
FIG. 2 shows a block diagram of an exemplary design of a transmitter.

FIG. 2 shows a block diagram of transmitter 120 and the measurement portion of wireless device 100. Power amplifier 140 may be designed to drive a certain output impedance $Z_{PA}$, which may be dependent on the peak output power level and the power supply voltage for power amplifier 140. Antenna 158 may have a particular target load impedance $Z_O$. For example, the output impedance of power amplifier 140 may be about 4 Ohms whereas the target load impedance may be 50 Ohms. Tunable matching circuit 150 performs impedance matching from $Z_{PA}$ to $Z_O$. In FIG. 2, matching circuit 150 and subsequent circuits such as antenna 158 in FIG. 1 are modeled with (i) a series circuit 250 having an impedance of $Z_S$ and (ii) a shunt load 260 having an impedance of $Z_L$. Series circuit 250 may comprise (i) an inductor coupled between the input and output of circuit 250, (ii) a capacitor coupled between the input and output of circuit 250, (iii) an inductor and a capacitor coupled in parallel and between the input and output of circuit 250, (iv) an inductor and a capacitor coupled in series and between the input and output of circuit 250, or (v) some other circuit component or combination of circuit components. Load 260 may include circuits coupled between matching circuit 150 and antenna 158 such as duplexers, switches, etc.

Referring back to FIG. 1, matching circuit 150 may be used to match the PA output impedance $Z_{PA}$ to the target load impedance $Z_O$ in order to achieve good performance. Matching circuit 150 may be a fixed matching circuit that may be designed to provide good performance (e.g., high PA efficiency) at the maximum output power level with the target load impedance. However, this fixed matching circuit may provide suboptimal performance (e.g., lower PA efficiency) at lower output power levels and/or different load impedances. For example, the load impedance may change due to antenna 158 being covered by a user's hand, antenna 158 being pressed against the user's ear, antenna 158 being shorted or disconnected, etc.

To improve performance, matching circuit 150 may provide tunable impedance matching for power amplifier 140. The tunable impedance matching may be dynamically varied based on the impedance of load 260, the power delivered to load 260, and/or other parameters. These parameters may be determined by sensor 160 and computation unit 170.

Figure 3:
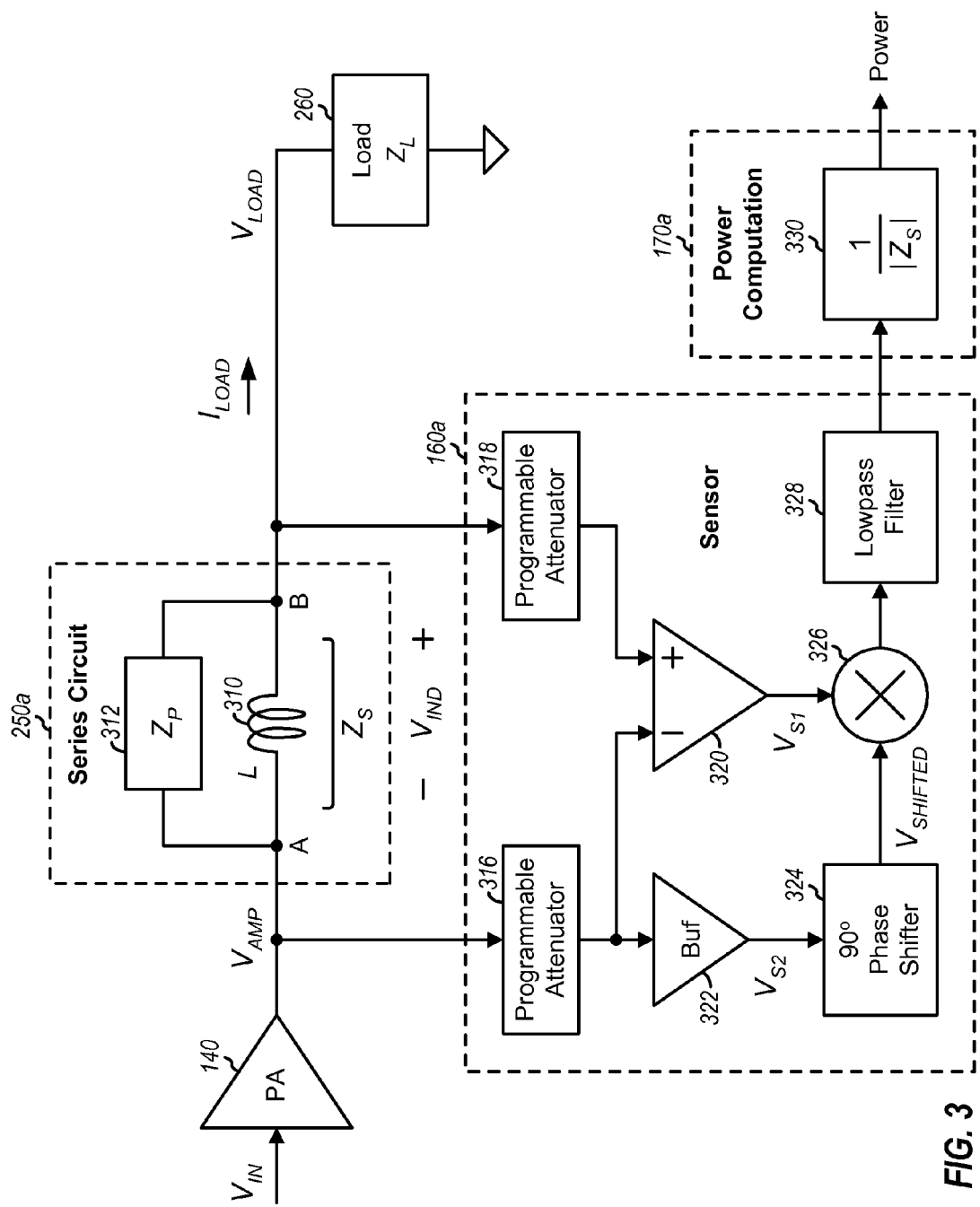
FIGS. 3 through 9 show block diagrams of various exemplary designs of power and impedance measurement circuits.

FIG. 3 shows a block diagram of a sensor 160a, a computation unit 170a, and a series circuit 250a, which are one exemplary design of sensor 160, computation unit 170, and series circuit 250, respectively, in FIG. 2. Within series circuit 250a, an inductor 310 and a reactive element 312 are coupled in parallel, and the combination is coupled between an input node A and an output node B of series circuit 250a. Reactive element 312 may comprise a variable capacitor, other circuit elements, parasitic components, etc. Series circuit 250a has an impedance of $Z_S$ between nodes A and B, which may be expressed as:

$$Z_s = \frac{j\omega \cdot L \cdot Z_p}{Z_p + j\omega \cdot L}, \quad \text{Eq (1)}$$

where $\omega$ is the frequency of interest, in units of radian/second,

L is the inductance of inductor 310, and $Z_P$ is the impedance of reactive element 312.

Series circuit 250a delivers an output current of $I_{LOAD}$ to load 260, which may be expressed as:

$$I_{LOAD} = I_{LOAD\_PK} \cdot \exp j(\omega t + \phi), \quad \text{Eq (2)}$$

where $I_{LOAD\_PK}$ is the peak current delivered to load 260, $\phi$ is a phase that is dependent on the impedance of load 260, and exp( ) denotes the natural exponent.

If the $Z_S$ impedance is inductive, then the $I_{LOAD}$ current would lag the $V_{AMP}$ voltage by 90° or $\pi/2$. Phase $\phi$ may be dependent on mismatch between matching circuit 150 and the load and may be close to 0 degrees with good matching.

Within sensor 160a, a programmable attenuator 316 receives the amplified RF signal and provides a first input signal. A programmable attenuator 318 receives the output RF signal and provides a second input signal. Programmable attenuators 316 and 318 may provide variable amounts of attenuation depending on the output power level in order to reduce the dynamic range of the input signals provided to the circuits within sensor 160a. A fixed-gain amplifier 320 receives the first input signal at an inverting input and the second input signal at a non-inverting input and provides a first sensed signal, $V_{S1}$. The $V_{S1}$ signal may be indicative of the voltage drop $V_{IND}$ across series circuit 250a and may be expressed as:

$$V_{S1} \approx V_{IND} = I_{LOAD} \cdot Z_S = I_{LOAD\_PK} \cdot \exp j(\omega t + \phi + \pi/2) \cdot |Z_S|. \quad \text{Eq (3)}$$

A buffer (Buf) 322 receives the first input signal and provides a second sensed signal, $V_{S2}$, which may be indicative of the $V_{AMP}$ signal. A phase shifter 324 receives and shifts the second sensed signal by 90° at the frequency of interest and provides a phase-shifted signal, $V_{SHIFTED}$. The amplified RF signal and the phase-shifted signal may be expressed as:

$$V_{S2} \approx V_{AMP} = V_{AMP\_PK} \cdot \exp j(\omega t), \text{ and} \quad \text{Eq (4)}$$

$$V_{SHIFTED} \approx V_{AMP\_PK} \cdot \exp j(\omega t + \pi/2), \quad \text{Eq (5)}$$

where $V_{AMP\_PK}$ is the peak voltage of the amplified RF signal.

A multiplier 326 multiplies the phase-shifted signal from phase shifter 324 with the first sensed signal from amplifier 322 and provides a multiplier output, $Y_{MULT}$, which may be expressed as:

$$Y_{MULT} = V_{SHIFTED} \cdot V_{S1} \quad \text{Eq (6)}$$

$$= V_{AMP\_PK} \cdot \cos\left(\omega t + \frac{\pi}{2}\right) \cdot I_{LOAD\_PK} \cdot |Z_S| \cdot$$

$$\cos\left(\omega t + \phi + \frac{\pi}{2}\right).$$

As shown in equation (6), the multiplier output includes a high frequency component at twice the frequency of interest and a low frequency component with the load-dependent phase $\phi$. A lowpass filter 328 receives the multiplier output, filters out the high frequency component, and provides a sensor output, $Y_{OUT}$, which may be expressed as:

$$Y_{OUT} = V_{AMP\_PK} \cdot I_{LOAD\_PK} \cdot |Z_S| \cdot \cos(\phi). \quad \text{Eq (7)}$$

Within computation unit 170a, a unit 330 divides the sensor output by the magnitude of impedance $Z_S$ and provides the delivered power, $P_{OUT}$, which may be expressed as:

$$P_{OUT} = V_{AMP\_PK} \cdot I_{LOAD\_PK} \cdot \cos(\phi). \quad \text{Eq (8)}$$

In the exemplary design shown in FIG. 3, the $V_{AMP}$ signal is phase shifted and multiplied with the $V_{S1}$ signal. The output power $P_{OUT}$ may then be the power delivered to series circuit 250a and load 260. Since series circuit 250a may have a small loss, most of $P_{OUT}$ may be delivered to load 260.

In another exemplary design not shown in FIG. 3, the $V_{LOAD}$ signal may be phase shifted and multiplied with the $V_{S1}$ signal. The output power may then be the power delivered to load 260. The output power from computation unit 170a may thus be indicative of the power delivered at the point in which a signal is tapped and provided to phase shifter 324.

The magnitude of the series impedance, $|Z_S|$, may be determined in various manners. In one design, $|Z_S|$ may be determined via computer simulation, empirical measurement, or by other means. In another design, $|Z_S|$ may be calibrated ahead of time. For example, the sensor output $Y_{OUT}$ may be measured for a known output power, and $|Z_S|$ may be determined based on the known output power and the measured sensor output. $|Z_S|$ may also be determined in other manners.

Figure 4:
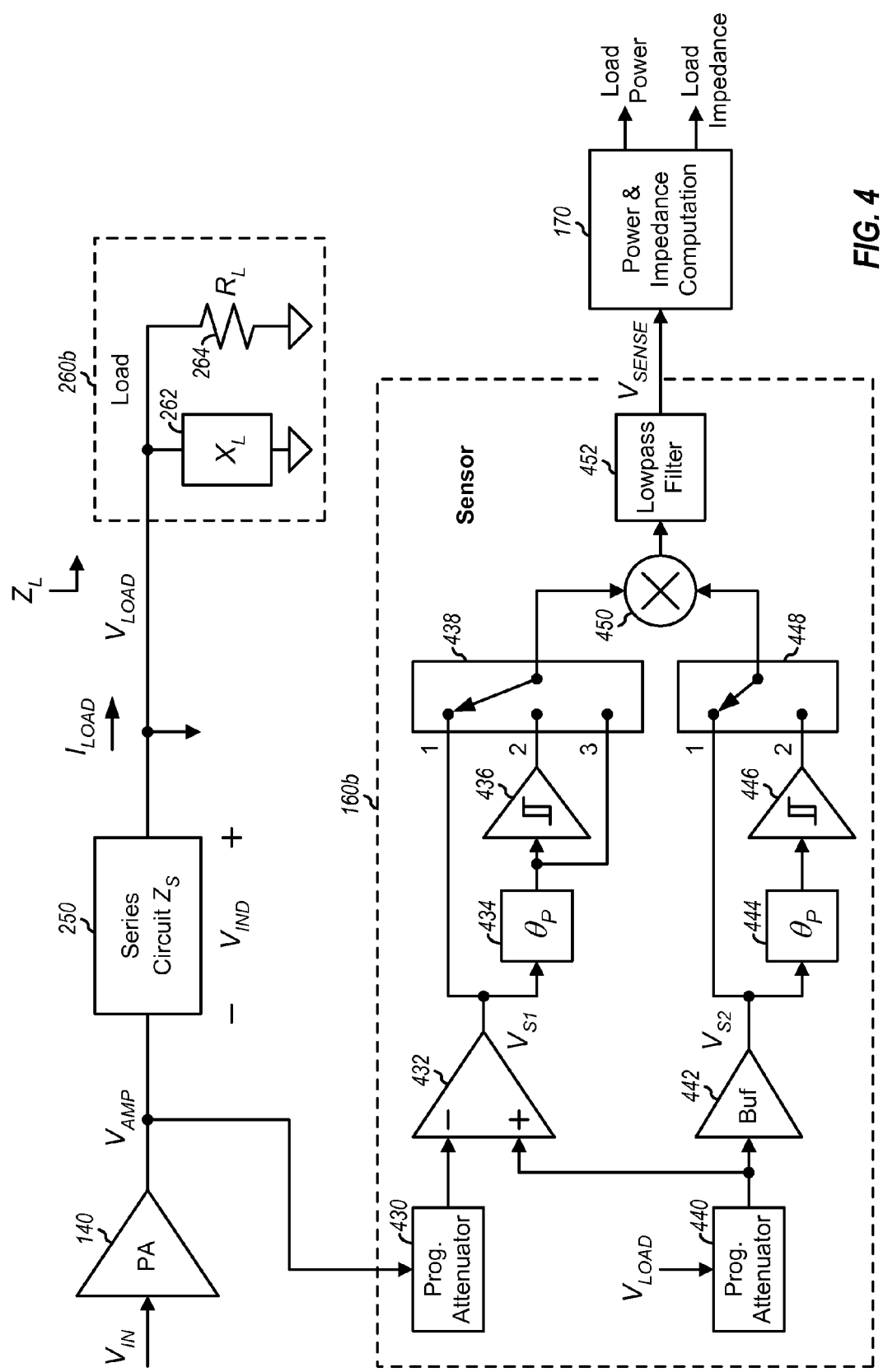

FIG. 4 shows a block diagram of a sensor 160b and a load 260b, which are another exemplary design of sensor 160 and load 260 in FIG. 2. Load 260b includes a shunt reactance element 262 having a reactance of $X_L$ and a shunt resistor 264 having a resistance of $R_L$. The load impedance $Z_L$ may be expressed as:

$$Z_L = \frac{1}{\frac{1}{R_L} + \frac{1}{jX_L}}. \qquad \text{Eq (9)}$$

The amplified RF signal from power amplifier 140 may be expressed as:

$$V_{AMP} = V_{AMP\_PK} \cdot \cos(\omega t), \qquad \text{Eq (10)}$$

where $V_{AMP\_PK}$ is the peak voltage from power amplifier 140.

A voltage signal across series circuit 250 may be expressed as:

$$V_{IND} = V_{IND\_PK} \cdot \sin(\omega t + \theta_L), \qquad \text{Eq (11)}$$

where $V_{IND\_PK}$ is the peak voltage across series circuit 250, and $\theta_L$ is the phase of load 260.

A voltage signal across load 260 may be expressed as:

$$V_{LOAD} = V_{LOAD\_PK} \cdot \cos(\omega t), \qquad \text{Eq (12)}$$

where $V_{LOAD\_PK}$ is the peak voltage across load 260.

An output current provided to load 260 may be expressed as:

$$I_{LOAD} = I_{LOAD\_PK} \cdot \cos(\omega t + \theta_L), \qquad \text{Eq (13)}$$

where $I_{LOAD\_PK}$ is the peak current provided to load 260.

Within sensor 160b, a programmable (Prog.) attenuator 430 receives the amplified RF signal from power amplifier 140 and provides a first input signal. A programmable attenuator 440 receives the output RF signal at the load and provides a second input signal. A fixed-gain amplifier 432 receives the first input signal at an inverting input and the second input signal at a non-inverting input. Amplifier 432 provides a first sensed signal, $V_{S1}$, which may be approximately equal to the $V_{IND}$ signal across series circuit 250. Amplifier 432 provides the first sensed signal to a first input of a switch 438 and also to a phase shifter 434. Phase shifter 434 shifts the first sensed signal by $\theta_P$ and provides a first phase-shifted signal to a limiter 436 and also to a third input of switch 438. $\theta_P$ may be zero degrees or some other value. Limiter 436 amplifies and clips the first phase-shifted signal and provides a first limited signal to a second input of switch 438. Switch 438 couples one of the three inputs to an output, which provides a first mixer input signal to a mixer 450.

A buffer 442 receives and buffers the second input signal and provides a second sensed signal, $V_{S2}$, which may be approximately equal to the $V_{LOAD}$ signal at load 260. Buffer 442 provides the second sensed signal to a first input of a switch 448 and also to a phase shifter 444. Phase shifter 444 shifts the second sensed signal by $\theta_P$ and provides a second phase-shifted signal to a limiter 446. Limiter 446 amplifies and clips the second phase-shifted signal and provides a second limited signal to a second input of switch 448. Switch 448 couples one of the two inputs to an output, which provides a second mixer input signal to mixer 450. Mixer 450 mixes the first mixer input signal from switch 438 with the second mixer input signal from switch 448 provides a mixer output signal. A lowpass filter 452 filters the mixer output signal and provides a sensor output signal, $V_{SENSE}$.

Multiple measurements may be made with switches 438 and 448 in different positions. Table 1 lists five switch configurations 1 through 5 for switches 438 and 448 and provides the sensor output for each switch configuration. In Table 1, the first column provides the switch configuration, the second column provides the input selected by switch 438, the third column provides the input selected by switch 448, the fourth column provides the sensor output with an arbitrary phase shift $\theta_P$, and the fifth column provides the sensor output with a phase shift of zero, or $\theta_P = 0$. Sensor outputs $V_A$ through $V_E$ may be obtained for switch configurations 1 through 5, respectively.

TABLE 1

| Switch Conf. | Switch 438 | Switch 448 | $V_{SENSE}$ | $V_{SENSE}$ (with $\theta_P = 0$) |
|---|---|---|---|---|
| 1 | 1 | 2 | $V_A = V_{IND\_PK} \cdot \sin(\theta_L - \theta_P)$ | $V_A = V_{IND\_PK} \cdot \sin(\theta_L)$ |
| 2 | 2 | 1 | $V_B = V_{LOAD\_PK} \cdot \sin(\theta_L + \theta_P)$ | $V_B = V_{LOAD\_PK} \cdot \sin(\theta_L)$ |
| 3 | 1 | 1 | $V_C = V_{LOAD\_Pk} \cdot V_{IND\_PK} \cdot \sin(\theta_L)$ | |
| 4 | 2 | 2 | $V_D = \sin(\theta_L)$ | |
| 5 | 3 | 1 | $V_E = V_{LOAD\_PK} \cdot V_{IND\_PK} \cdot \sin(\theta_L + \theta_P)$ | |

Mixer 450 may operate as a multiplier when both input signals are not limited or as a downconverter when at least one input signal is limited. An input signal that is limited can act as a local oscillator (LO) signal that can switch a differential pair within mixer 450 to achieve downconversion. Since the limited input signal is used only for switching, the amplitude of the limited input signal is not reflected in the mixer output signal. Mixer 450 thus operates differently than multiplier 326 in FIG. 3 for switch configurations 1, 2 and 4. For simplicity, the description herein assumes unity gain for each mixer.

Computation unit 170 receives measurements from sensor 160b and computes various quantities of interest. As shown in Table 1, the phase of the load may be determined by selecting switch configuration 4 and obtaining measurement $V_D$. The magnitude of the load impedance, $|Z_L|$, may be determined based on measurements $V_A$ and $V_B$ with $\theta_P = 0$ and may be computed as follows:

$$|Z_L| = \frac{V_B}{V_A} \cdot Z_S = \frac{V_{LOAD\_PK} \cdot \sin(\theta_L)}{V_{IND\_PK} \cdot \sin(\theta_L)} \cdot Z_S = \frac{V_{LOAD\_PK}}{V_{IND\_PK}} \cdot Z_S = \frac{V_{LOAD\_PK}}{I_{LOAD\_PK}}. \qquad \text{Eq (14)}$$

The impedance $Z_S$ of series circuit 250 may be known or can be ascertained.

The load impedance $Z_L$ may be computed as follows:

$$Z_L = |Z_L| \cdot [\cos(\theta_L) + j \sin(\theta_L)], \qquad \text{Eq (15)}$$

where $\cos(\theta_L)$ and $\sin(\theta_L)$ may be determined based on measurement $V_D$.

The peak output voltage $V_{LOAD\_PK}$ may be determined based on measurements $V_B$ and $V_D$ and may be computed as follows:

$$V_{LOAD\_PK} = \frac{V_B}{V_D} = \frac{V_{LOAD\_PK} \cdot \sin(\theta_L)}{\sin(\theta_L)}. \qquad \text{Eq (16)}$$

The peak output current $I_{LOAD\_PK}$ may be determined based on measurements $V_B$ and $V_D$ and the load impedance magnitude $|Z_L|$ and may be computed as follows:

$$I_{LOAD\_PK} = \frac{V_B}{V_D} \cdot \frac{1}{|Z_L|} = \frac{V_{LOAD\_PK} \cdot \sin(\theta_L)}{\sin(\theta_L)} \cdot \frac{1}{|Z_L|} = \frac{V_{LOAD\_PK}}{|Z_L|}. \qquad \text{Eq (17)}$$

The power $P_L$ delivered to load 260 may be computed as follows:

$$P_L = \frac{V_{LOAD\_PK}^2}{2 \cdot |Z_L|} \cdot \cos(\theta_L). \qquad \text{Eq (18)}$$

Each quantity in the right hand side of equation (18) may be determined as described above.

Switch configuration 5 may be used as a root-mean-square (RMS) power detector. With $\theta_L=90°$, measurement $V_E$ may be expressed as:

$$V_E = V_{VLOAD\_PK} \cdot V_{IND\_PK} \cdot \cos(\theta_L). \qquad \text{Eq (19)}$$

Other measurements may also be obtained with other switch configurations for sensor 160b in FIG. 4. Other quantities may also be computed based on the various measurements available from sensor 160b. Phase shifters 434 and 444 may provide the same phase, which may be 0°, 90°, or some other phase. Phase shifters 434 and 444 may also provide different phases. For example, one phase shifter may provide 0° phase shift, and the other phase shifter may provide 90° phase shift.

Figure 5:
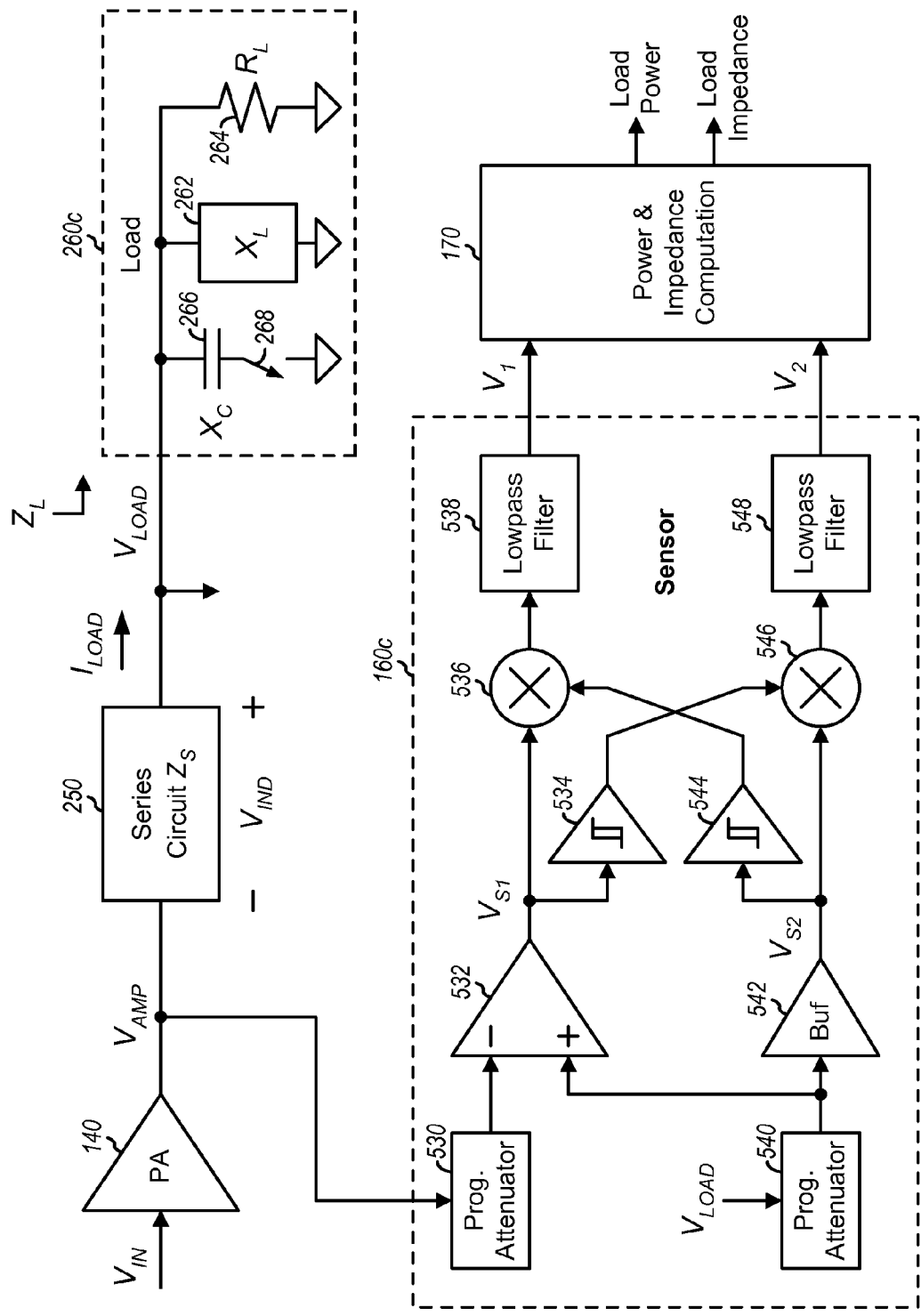

FIG. 5 shows a block diagram of a sensor 160c and a load 260c, which are another exemplary design of sensor 160 and load 260 in FIG. 2. Load 260c includes shunt reactance element 262 having a reactance of $X_L$ and shunt resistor 264 having a resistance of $R_L$. Load 260c further includes a shunt capacitor 266 having a reactance of $X_C$ and coupled in series with a switch 268. The load impedance $Z_{L1}$ with switch 268 opened and the load impedance $Z_{L2}$ with switch 268 closed may be expressed as:

$$Z_{L1} = \frac{1}{\frac{1}{R_L} + \frac{1}{jX_L}} \qquad \text{Eq (20)}$$

and $$Z_{L2} = \frac{1}{\frac{1}{R_L} + \frac{1}{jX_L} + \frac{1}{jX_C}}.$$

The capacitance or reactance of capacitor 266 may be known or can be ascertained.

Within sensor 160c, a programmable attenuator 530 receives the $V_{AMP}$ signal and provides a first input signal. A programmable attenuator 540 receives the $V_{LOAD}$ signal and provides a second input signal. A fixed-gain amplifier 532 receives the first input signal at an inverting input and the second input signal at a non-inverting input and provides a first sensed signal, $V_{S1}$, to a limiter 534 and also to a mixer 536. Limiter 534 amplifies and clips the first sensed signal and provides a first limited signal to a mixer 546. A buffer 542 receives and buffers the second input signal and provides a second sensed signal, $V_{S2}$, to a limiter 544 and also to mixer 546. Limiter 544 amplifies and clips the second sensed signal and provides a second limited signal to mixer 536. Mixer 536 mixes the first sensed signal from amplifier 532 with the second limited signal from limiter 544 and provides a first mixer output signal. A lowpass filter 538 filters the first mixer output signal and provides a first sensor output signal, $V_1$. Similarly, mixer 546 mixes the second sensed signal from buffer 542 with the first limited signal from limiter 534 and provides a second mixer output signal. A lowpass filter 548 filters the second mixer output signal and provides a second sensor output signal, $V_2$. The $V_1$ and $V_2$ sensor outputs may be expressed as:

$$V_1 = V_{IND\_PK} \cdot \sin(\omega_L), \text{ and} \qquad \text{Eq (21)}$$

$$V_2 = V_{LOAD\_PK} \cdot \sin(\theta_L). \qquad \text{Eq (22)}$$

Computation unit 170 receives the $V_1$ and $V_2$ sensor outputs from sensor 160c for a first measurement with switch 268 opened and also for a second measurement with switch 268 closed. Computation unit 170 computes various quantities of interest based on the first and second measurements.

The magnitude of the load impedance $|Z_{L1}|$ may be determined based on measurements $V_1$ and $V_2$ with switch 268 opened. The magnitude of the load impedance $|Z_{L2}|$ may be determined based on measurements $V_1$ and $V_2$ with switch 268 closed. $|Z_{L1}|$ and $|Z_{L2}|$ may be computed as follows:

$$|Z_{L1}| = \frac{V_2}{V_1} \cdot Z_S,$$

with $V_1$ and $V_2$ obtained with switch 268 opened, Eq (23)

$$|Z_{L2}| = \frac{V_2}{V_1} \cdot Z_S,$$

with $V_1$ and $V_2$ obtained with switch 268 closed. Eq (24)

The following quantities may be defined:

$$|Y_{L1}|^2 = \frac{1}{|Z_{L1}|^2} = \frac{1}{R_L^2} + \frac{1}{X_L^2}, \qquad \text{Eq (25)}$$

and $$|Y_{L2}|^2 = \frac{1}{|Z_{L2}|^2} = \frac{1}{R_L^2} + \left(\frac{1}{X_L} + \frac{1}{X_C}\right)^2. \qquad \text{Eq (26)}$$

The shunt reactance $X_L$ and the shunt resistance $R_L$ may be determined based on equations (25) and (26), as follows:

$$X_L = \frac{2}{(|Y_{L2}|^2 - |Y_{L1}|^2 - 1/X_C^2) \cdot X_C}, \qquad \text{Eq (27)}$$

and $$R_L = \sqrt{\frac{1}{(|Y_{L1}|^2 - 1/X_L^2)}}. \qquad \text{Eq (28)}$$

The load impedance $Z_{L1}$ may be determined based $X_L$ and $R_L$, as shown in equation (20). The phase of the load may be computed as follows:

$$\theta_L = a\tan\left(\frac{\text{Re}\{Z_{L1}\}}{\text{Im}\{Z_{L1}\}}\right), \qquad \text{Eq (29)}$$

where Re{ } denotes the real part and Im{ } denotes the imaginary part.

The peak output voltage $V_{LOAD\_PK}$ may be determined based on measurement $V_2$, as follows:

$$V_{LOAD\_PK} = \frac{V_2}{\sin(\theta_L)} = \frac{V_{LOAD\_PK} \cdot \sin(\theta_L)}{\sin(\theta_L)}. \qquad \text{Eq (30)}$$

The power delivered to load 260 may be computed as shown in equation (18). Other quantities may also be computed based on various measurements available from sensor 160c.

Figure 6:
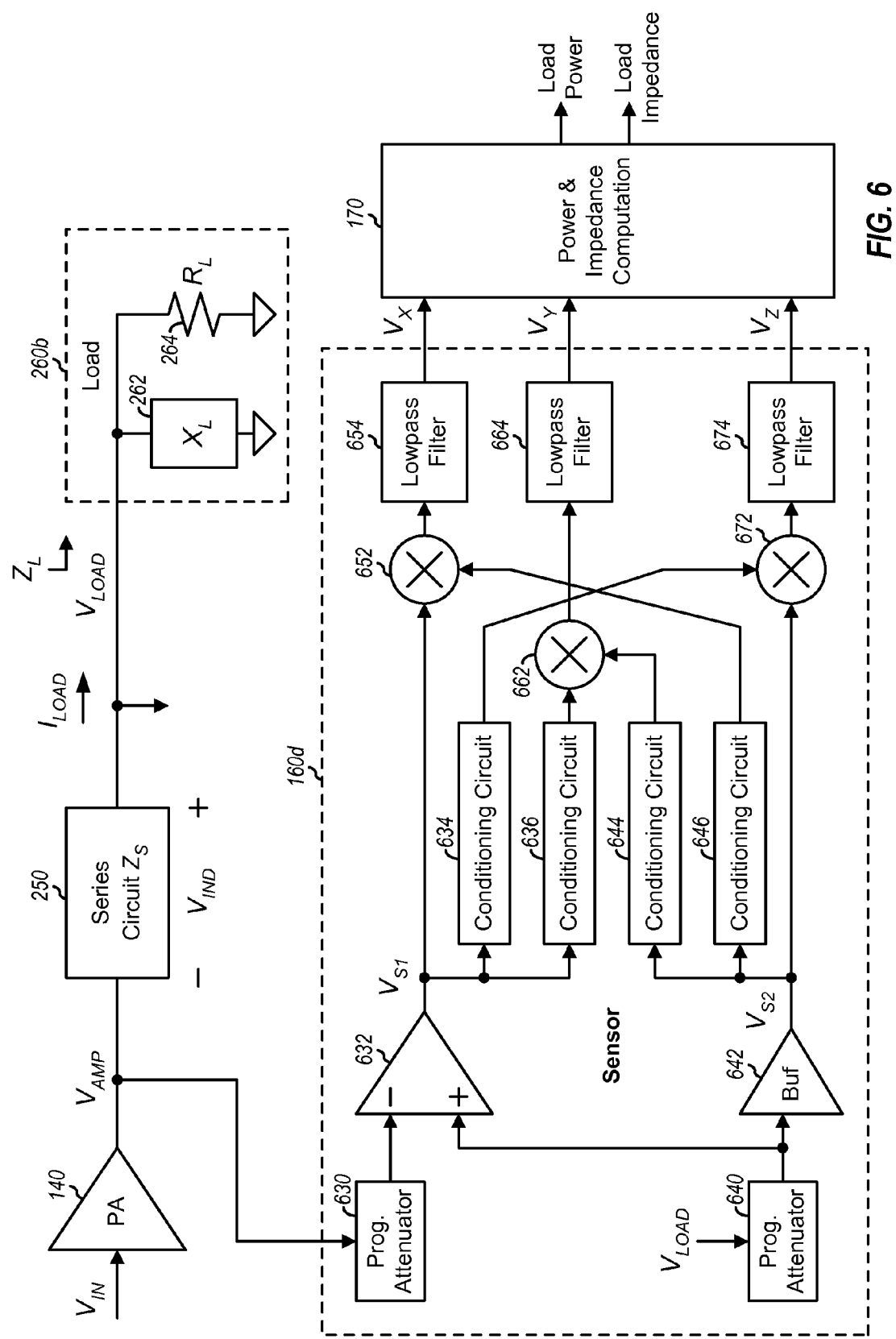

FIG. 6 shows a block diagram of a sensor 160d, which is another exemplary design of sensor 160 in FIG. 2. Within sensor 160d, a programmable attenuator 630 receives the $V_{AMP}$ signal and provides a first input signal. A programmable attenuator 640 receives the $V_{LOAD}$ signal and provides a second input signal. A fixed-gain amplifier 632 receives the first input signal at an inverting input and the second input signal at a non-inverting input and provides a first sensed signal, $V_{S1}$, to conditioning circuits 634 and 636 and also to a mixer 652. Conditioning circuits 634 and 636 process the first sensed signal and provide their output signals to mixers 672 and 662, respectively.

A buffer 542 receives and buffers the second input signal and provides a second sensed signal, $V_{S2}$, to conditioning circuits 644 and 646 and also to mixer 672. Conditioning circuits 644 and 646 process the second sensed signal and provide their output signals to mixers 662 and 652, respectively. Mixer 652 mixes the first sensed signal from amplifier 532 with an output signal from circuit 646 and provides a first mixer output signal. A lowpass filter 654 filters the first mixer output signal and provides a first sensor output signal, $V_X$. Mixer 662 mixes an output signal from circuit 636 with an output signal from circuit 644 and provides a second mixer output signal. A lowpass filter 664 filters the second mixer output signal and provides a second sensor output signal, $V_Y$. Mixer 672 mixes an output signal from circuit 634 with the second sensed signal from buffer 642 and provides a third mixer output signal. A lowpass filter 674 filters the third mixer output signal and provides a third sensor output signal, $V_Z$.

Each conditioning circuit may comprise one of the following:
- A wire that simply passes the input signal as the output signal,
- A phase shifter that shifts the input signal by $\theta_P$ and provides a phase-shifted signal,
- A limiter that amplifies and clips the input signal and provides a limited signal,
- A phase shifter and a limiter that shift, amplify, and clip the input signal and provide a phase-shifted and limited signal, or
- Some other circuit or combination of circuits.

Multiple conditioning circuits may also share a circuit element. For example, conditioning circuits 634 and 636 may share a phase shifter or a limiter. Various exemplary designs may be obtained with conditioning circuits 634, 636, 644 and 646 implemented with different circuits.

In a first exemplary design, conditioning circuit 634 includes a limiter, conditioning circuit 636 includes a limiter and a phase shifter providing 90° phase shift, conditioning circuit 644 includes a wire, and conditioning circuit 646 includes a limiter and a phase shifter providing −90° phase shift. The $V_X$, $V_Y$ and $V_X$ signals may then be expressed as shown in Table 2 for the first design.

TABLE 2

| Design | $V_X$ | $V_Y$ | $V_Z$ |
|---|---|---|---|
| First | $V_{IND\_PK} \cdot \cos(\theta_L)$ | $V_{LOAD\_PK} \cdot \cos(\theta_L)$ | $V_{LOAD\_PK} \cdot \sin(\theta_L)$ |
| Second | $V_{IND\_PK} \cdot \cos(\theta_L)$ | $V_{IND\_PK} \cdot \sin(\theta_L)$ | $V_{LOAD\_PK} \cdot \cos(\theta_L)$ |
| Third | $V_{IND\_PK} \cdot \sin(\theta_L)$ | $V_{LOAD\_PK} \cdot \sin(\theta_L)$ | $V_{LOAD\_PK} \cdot \cos(\theta_L)$ |
| Fourth | $V_{IND\_PK} \cdot \sin(\theta_L)$ | $V_{IND\_PK} \cdot \cos(\theta_L)$ | $V_{LOAD\_PK} \cdot \sin(\theta_L)$ |
| Fifth | $V_{IND\_PK} \cdot \sin(\theta_L)$ | $\sin(\theta_L)$ | $V_{LOAD\_PK} \cdot \sin(\theta_L)$ |
| Sixth | $V_{IND\_PK} \cdot \cos(\theta_L)$ | $\cos(\theta_L)$ | $V_{LOAD\_PK} \cdot \cos(\theta_L)$ |

For the first exemplary design, the magnitude of the load impedance $|Z_L|$ may be determined based on measurements $V_X$ and $V_Y$ as follows:

$$|Z_L| = \frac{V_Y}{V_X} \cdot Z_S. \qquad \text{Eq (31)}$$

The phase of the load impedance may be computed as follows:

$$\theta_L = a\tan\left(\frac{V_Z}{V_Y}\right). \qquad \text{Eq (32)}$$

The load impedance $Z_L$ may be computed as shown in equation (15). The peak output voltage $V_{LOAD\_PK}$ may be computed as follows:

$$V_{LOAD\_PK} = \frac{V_Y}{\cos(\theta_L)} = \frac{V_Z}{\sin(\theta_L)}, \qquad \text{Eq (33)}$$

where $\sin(\theta_L)$ and $\cos(\theta_L)$ may be determined based on the load phase $\theta_L$ obtained from equation (32).

The peak output current $I_{LOAD\_PK}$ may be computed as follows:

$$I_{LOAD\_PK} = \frac{V_{LOAD\_PK}}{|Z_L|}. \qquad \text{Eq (34)}$$

The power delivered to load 260 may be computed as shown in equation (18). Other quantities may also be computed based on the measurements available from sensor 160d.

In a second exemplary design, conditioning circuit 634 includes a limiter and a phase shifter providing 90° phase shift, conditioning circuit 636 includes a wire, conditioning circuit 644 includes a limiter, and conditioning circuit 646 includes a limiter and a phase shifter providing −90° phase shift. The $V_X$, $V_Y$ and $V_X$ signals may be expressed as shown in Table 2 for the second design.

In a third exemplary design, conditioning circuit 634 includes a limiter and a phase shifter providing 90° phase shift, conditioning circuit 636 includes a limiter, conditioning circuit 644 includes a wire, and conditioning circuit 646 includes a limiter. The $V_X$, $V_Y$ and $V_X$ signals may be expressed as shown in Table 2 for the third design.

In a fourth exemplary design, conditioning circuit 634 includes a limiter, conditioning circuit 636 includes a phase shifter providing 90° phase shift, and conditioning circuits 644 and 646 share a limiter. The $V_X$, $V_Y$ and $V_X$ signals may be expressed as shown in Table 2 for the fourth design.

tor 272 having a resistance of $R_{LS}$ coupled in series with a reactance element 274 having a reactance of $X_{LS}$. Sensor 160e includes all circuit components in sensor 160b in FIG. 4 with one difference. Buffer 442 in sensor 160e receives the first input signal obtained from the $V_{AMP}$ signal from power amplifier 140, instead of the second input signal obtained from the $V_{LOAD}$ signal provided to load 260e. Power amplifier 140 observes an input impedance $Z_{IN}$, which has a magnitude of $|Z_{IN}|$ and a phase of $\theta_{IN}$. Different measurements $V_A$ through $V_E$ may be obtained with different switch configurations, as shown in Table 3.

TABLE 3

| Switch Conf. | Switch 438 | Switch 448 | $V_{SENSE}$ | $V_{SENSE}$ (with $\theta_P = 0$) |
|---|---|---|---|---|
| 1 | 1 | 2 | $V_A = V_{IND\_PK} \cdot \sin(\theta_{IN} - \theta_P)$ | $V_A = V_{IND\_PK} \cdot \sin(\theta_{IN})$ |
| 2 | 2 | 1 | $V_B = V_{AMP\_PK} \cdot \sin(\theta_{IN} + \theta_P)$ | $V_B = V_{AMP\_PK} \cdot \sin(\theta_{IN})$ |
| 3 | 1 | 1 | $V_C = V_{AMP\_PK} \cdot V_{IND\_PK} \cdot \sin(\theta_{IN})$ | |
| 4 | 2 | 2 | $V_D = \sin(\theta_{IN})$ | |
| 5 | 3 | 1 | $V_E = V_{AMP\_PK} \cdot V_{IND\_PK} \cdot \sin(\theta_{IN} + \theta_P)$ | |

In a fifth exemplary design, conditioning circuits 634 and 636 share a limiter, and conditioning circuits 644 and 646 also share a limiter. The $V_X$, $V_Y$ and $V_X$ signals may be expressed as shown in Table 2 for the fifth design.

In a sixth exemplary design, conditioning circuits 634 and 636 share a limiter and a phase shifter providing 90° phase shift, conditioning circuit 644 includes a limiter, and conditioning circuit 646 includes a limiter and a phase shifter providing −90° phase shift. The $V_X$, $V_Y$ and $V_X$ signals may be expressed as shown in Table 2 for the sixth design.

Other exemplary designs may also be implemented with other circuits for conditioning circuits 634, 636, 644 and 646. For each exemplary design described above, various quantities such as the magnitude of the load impedance $|Z_L|$, the phase of the load $\theta_L$, the load impedance $Z_L$, the peak output voltage $V_{LOAD\_PK}$, the power delivered to the load $P_L$, and/or other quantities may be computed based on measurements $V_X$, $V_Y$ and $V_Z$. Different equations may be used to compute these various quantities due to different definitions of $V_X$, $V_Y$ and $V_Z$ for different designs, as shown in Table 2.

In the exemplary design shown in FIG. 6, the outputs of mixers 652, 662 and 672 are provided to three lowpass filters 654, 664 and 674, respectively. Lowpass filters 654, 664 and 674 can provide three measurements $V_X$, $V_Y$ and $V_Z$ concurrently. In another exemplary design, the outputs of mixers 652, 662 and 672 may be provided to three inputs of a switch, and the output of the switch may be coupled to a lowpass filter. The output of one mixer may be passed to the lowpass filter at any given moment. This exemplary design may reduce hardware complexity.

In the exemplary designs shown in FIGS. 4, 5 and 6, the magnitude of the load impedance $|Z_L|$, the load impedance $Z_L$, the load phase $\theta_L$, the peak output voltage $V_{LOAD\_PK}$, and the peak output current $I_{LOAD\_PK}$ may be determined based on measurements from sensor 160b, 160c or 160d. These various quantities relating to load 260 may be obtained by providing the $V_{LOAD}$ signal to the input of buffers 442, 542 and 642 in FIGS. 4, 5 and 6, respectively. Various quantities relating to the impedance at the output of power amplifier 140 may be obtained by providing the $V_{AMP}$ signal to the input of the buffers.

Figure 7:
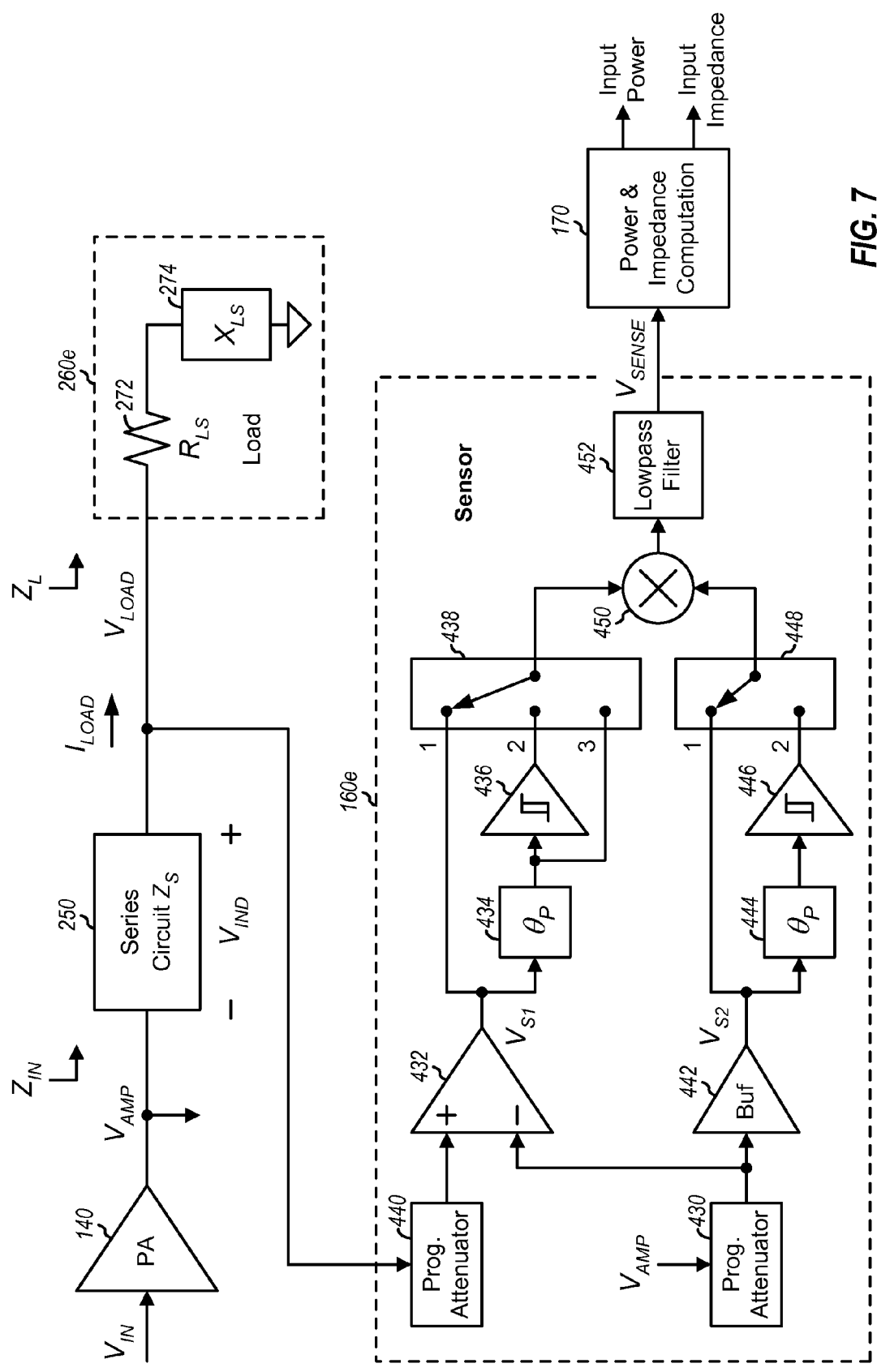

FIG. 7 shows a block diagram of a sensor 160e and a load 260e, which are another exemplary design of sensor 160 and load 260, respectively, in FIG. 2. Load 260e includes a resis- The magnitude of the input impedance, $|Z_{IN}|$, may be determined based on measurements $V_A$ and $V_B$ with $\theta_P=0$ and may be computed as follows:

$$|Z_{IN}| = \frac{V_B}{V_A} \cdot Z_S = \frac{V_{AMP\_PK} \cdot \sin(\theta_{IN})}{V_{IND\_PK} \cdot \sin(\theta_{IN})} \cdot Z_S = \frac{V_{AMP\_PK}}{V_{IND\_PK}} \cdot Z_S = \frac{V_{AMP\_PK}}{I_{LOAD\_PK}}. \quad \text{Eq (35)}$$

The input impedance $Z_{IN}$ may be computed as follows:

$$Z_{IN} = |Z_{IN}| \cdot [\cos(\theta_{IN}) + j\sin(\theta_{IN})], \quad \text{Eq (36)}$$

where $\cos(\theta_{IN})$ and $\sin(\theta_{IN})$ may be determined based on measurement $V_D$.

The peak amplified voltage $V_{AMP\_PK}$ may be determined based on measurements $V_B$ and $V_D$ and may be computed as follows:

$$V_{AMP\_PK} = \frac{V_B}{V_D} = \frac{V_{AMP\_PK} \cdot \sin(\theta_{IN})}{\sin(\theta_{IN})} \quad \text{Eq (37)}$$

The peak output current $I_{LOAD\_PK}$ may be determined based on measurements $V_B$ and $V_D$ and the input impedance magnitude $|Z_{IN}|$ and may be computed as follows:

$$I_{LOAD\_PK} = \frac{V_B}{V_D} \cdot \frac{1}{|Z_{IN}|} = \frac{V_{AMP\_PK} \cdot \sin(\theta_{IN})}{\sin(\theta_{IN})} \cdot \frac{1}{|Z_{IN}|} = \frac{V_{AMP\_PK}}{|Z_{IN}|}. \quad \text{Eq (38)}$$

The power delivered by power amplifier 140 may be computed as follows:

$$P_{AMP} = \frac{V_{AMP\_PK}^2}{2 \cdot |Z_{IN}|} \cdot \cos(\theta_{IN}). \quad \text{Eq (39)}$$

Each quantity in the right hand side of equation (39) may be determined as described above.

Figure 8:
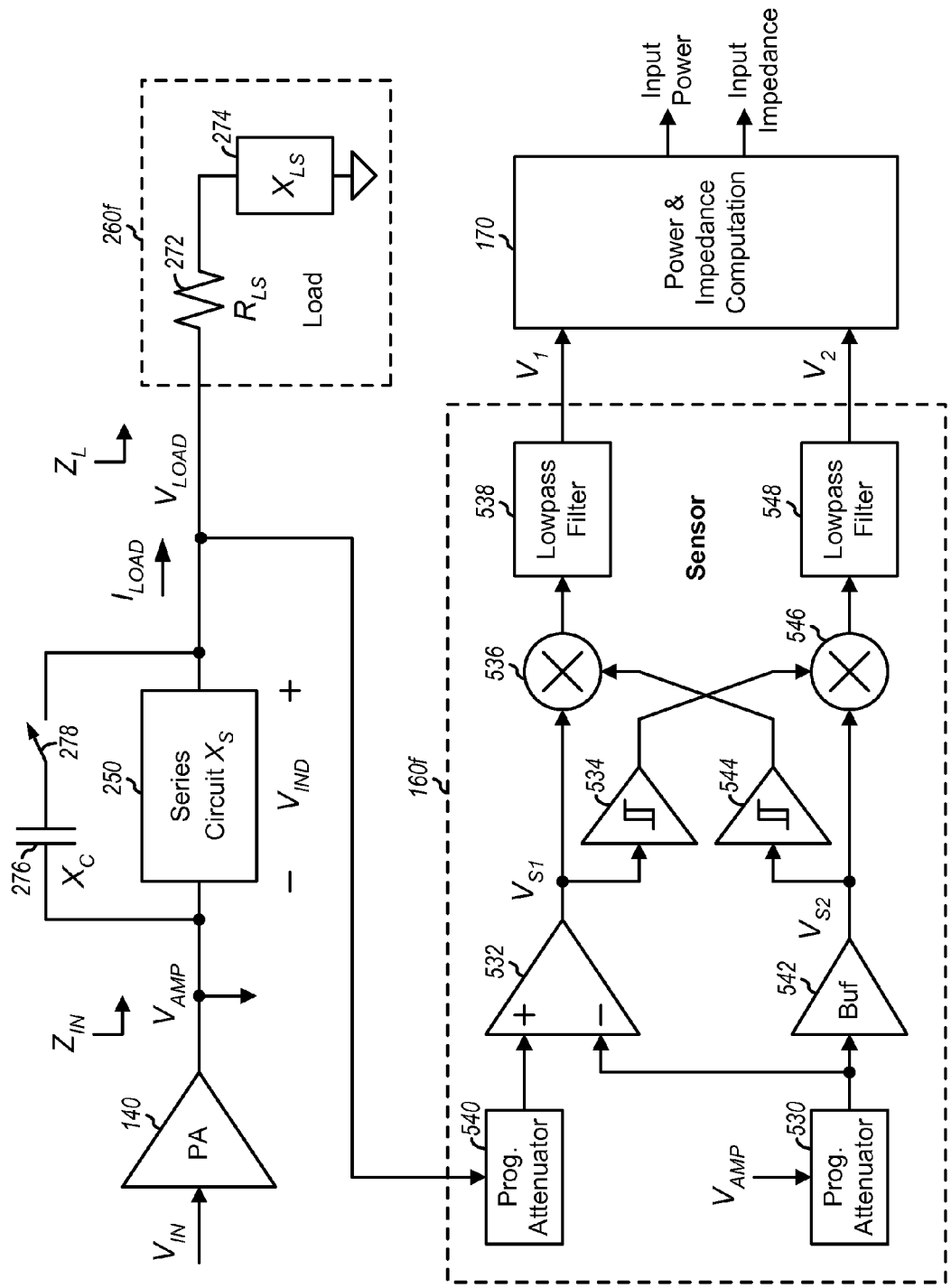

FIG. 8 shows a block diagram of a sensor 160f and a load 260f, which are another exemplary design of sensor 160 and load 260, respectively, in FIG. 2. Series circuit 250 has a reactance of $X_S$. Load 260f includes resistor 272 having a resistance of $R_{LS}$ coupled in series with reactance element 274 having a reactance of $X_{LS}$. A series capacitor 276 having a reactance of $X_C$ is coupled in series with a switch 278, and the combination if coupled in parallel with series circuit 250.

The input impedance $Z_{IN1}$ with switch 278 opened and the input impedance $Z_{IN2}$ with switch 278 closed may be expressed as:

$$Z_{IN1} = R_{LS} + j(X_S + X_{LS}) = R_{LS} + j X_{IN}, \text{ and} \quad \text{Eq (40)}$$

$$Z_{IN2} = R_{LS} + j(X_S + X_{LS} + X_{CEQ}) = R_{LS} + j(X_{IN} + X_{CEQ}), \quad \text{Eq (41)}$$

where $X_{IN} = X_S + X_{LS}$, and $\quad \text{Eq (42)}$ $$X_{CEQ} = \frac{1}{\frac{1}{X_S} - \frac{1}{X_C}} - X_S. \quad \text{Eq (43)}$$

Sensor 160f includes all circuit components in sensor 160c in FIG. 5 with one difference. Buffer 542 in sensor 160f receives the first input signal obtained from the $V_{AMP}$ signal from power amplifier 140, instead of the second input signal obtained from the $V_{LOAD}$ signal provided to load 260. The $V_1$ and $V_2$ sensor outputs may be expressed as:

$$V_1 = V_{IND\_PK} \cdot \sin(\theta_{IN}), \text{ and} \quad \text{Eq (44)}$$

$$V_2 = V_{AMP\_PK} \cdot \sin(\theta_{IN}). \quad \text{Eq (45)}$$

The magnitude of input impedance $|Z_{IN1}|$ may be determined based on measurements $V_1$ and $V_2$ with switch 278 opened. The magnitude of load impedance $|Z_{IN2}|$ may be determined based on measurements $V_1$ and $V_2$ with switch 278 closed. $|Z_{IN1}|$ and $|Z_{IN2}|$ may be computed as follows:

$$|Z_{IN1}| = \frac{V_2}{V_1} \cdot X_S,$$

with $V_1$ and $V_2$ obtained with switch 278 opened, Eq (46)

$$|Z_{IN2}| = \frac{V_2}{V_1} \cdot X_S,$$

with $V_1$ and $V_2$ obtained with switch 278 closed. Eq (47)

The following quantities may be defined:

$$|Z_{IN1}|^2 = R_{LS}^2 + X_{IN}^2, \text{ and} \quad \text{Eq (48)}$$

$$|Z_{IN2}|^2 = R_{LS}^2 + (X_{IN} + X_{CEQ})^2. \quad \text{Eq (49)}$$

The input reactance $X_{IN}$ and the load impedance $Z_L$ may be determined as follows:

$$X_{IN} = \frac{|Z_{IN2}|^2 - |Z_{IN1}|^2 - X_{CEQ}^2}{2 \cdot X_{CEQ}}, \quad \text{Eq (50)}$$

$$X_{LS} = X_{IN} - X_S, \quad \text{Eq (51)}$$

$$R_{LS} = \sqrt{|Z_{IN1}|^2 - X_{IN}^2}, \quad \text{Eq (52)}$$

and $$Z_L = R_{LS} + jX_{LS}. \quad \text{Eq (53)}$$

The power delivered by power amplifier 140 may be computed as follows:

$$P_{AMP} = \frac{V_{AMP\_PK}^2}{2 \cdot |Z_{IN}|} \cdot \cos(\theta_{IN}) = \frac{V_{AMP\_PK}^2}{2 \cdot R_{LS}}. \quad \text{Eq (54)}$$

Figure 9:
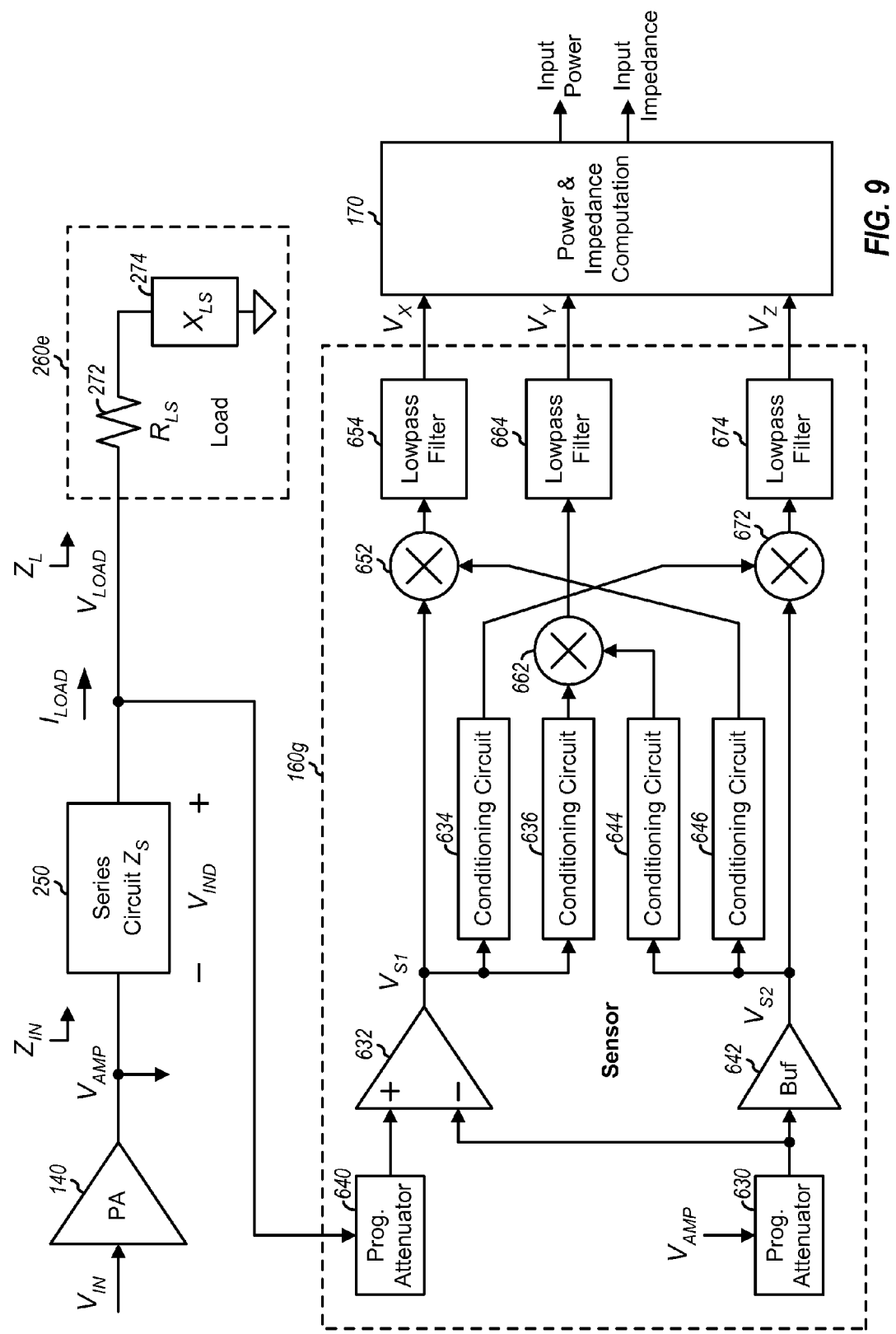

FIG. 9 shows a block diagram of a sensor 160g, which is another exemplary design of sensor 160 in FIG. 2. Sensor 160g includes all circuit components in sensor 160d in FIG. 6 with one difference. Buffer 642 in sensor 160g receives the first input signal obtained from the $V_{AMP}$ signal from power amplifier 140, instead of the second input signal obtained from the $V_{LOAD}$ signal provided to load 260.

The $V_X$, $X_Y$ and $X_Z$ sensor outputs are dependent on the circuits used for conditioning circuits 634, 636, 644 and 646. For the first exemplary design described above, conditioning circuit 634 includes a limiter, conditioning circuit 636 includes a limiter and a phase shifter providing 90° phase shift, conditioning circuit 644 includes a wire, and conditioning circuit 646 includes a limiter and a phase shifter providing −90° phase shift. The $V_X$, $V_Y$ and $V_X$ sensor outputs may then be expressed as:

$$V_X = V_{IND\_PK} \cdot \cos(\theta_{IN}), \quad \text{Eq (55)}$$

$$V_Y = V_{AMP\_PK} \cdot \cos(\theta_{IN}), \text{ and} \quad \text{Eq (56)}$$

$$V_Z = V_{AMP\_PK} \cdot \sin(\theta_{IN}). \quad \text{Eq (57)}$$

The magnitude of the input impedance $|Z_{IN}|$ may be determined based on measurements $V_X$ and $V_Y$ as follows:

$$|Z_{IN}| = \frac{V_Y}{V_X} \cdot X_S. \quad \text{Eq (58)}$$

The phase of the input impedance may be computed as follows:

$$\theta_{IN} = a\tan\left(\frac{V_Z}{V_Y}\right). \quad \text{Eq (59)}$$

The input impedance $Z_{IN}$ may be computed as shown in equation (36). The peak amplified voltage $V_{AMP\_PK}$ may be computed as follows:

$$V_{AMP\_PK} = \frac{V_Y}{\cos(\theta_{IN})} = \frac{V_Z}{\sin(\theta_{IN})}, \quad \text{Eq (60)}$$

where $\sin(\theta_{IN})$ and $\cos(\theta_{IN})$ may be determined based on the input phase $\theta_{IN}$ obtained from equation (59).

The peak amplified current $I_{LOAD\_PK}$ may be computed as follows:

$$I_{LOAD\_PK} = \frac{V_{AMP\_PK}}{|Z_{IN}|}. \quad \text{Eq (61)}$$

The power delivered by power amplifier 140 may be computed as shown in equation (54). Other quantities may also be computed based on the measurements available from sensor 160g.

Other exemplary designs may also be implemented with other circuits for conditioning circuits 634, 636, 644 and 646, as described above for FIG. 6. For each exemplary design described above, various quantities such as the magnitude of the input impedance $|Z_{IN}|$, the phase $\theta_{IN}$ of the input impedance, the input impedance $Z_{IN}$, the peak amplified voltage $V_{AMP\_PK}$, the power delivered by power amplifier $P_{AMP}$, and other quantities may be computed based on measurements $V_X$, $V_Y$ and $V_X$. Different equations may be used to compute these various quantities due to different definitions of $V_X$, $V_Y$ and $V_X$ for different exemplary designs.

FIGS. 3 through 9 show various exemplary designs of sensor 160 that may be used to measure voltages and other quantities, which may then be used to compute the power and/or impedance at any point of interest in a signal path. The exemplary designs in FIGS. 3 through 9 measure quantities in Cartesian coordinate, which defines a complex value by a real/inphase component and an imaginary/quadrature component. In the exemplary design shown in FIG. 3, units 320 through 328 may provide complex quantities, and unit 330 may provide the real component/part as the power of the load. In the exemplary designs shown in FIGS. 4 and 7, the $V_{SENSE}$ signal may comprise an inphase component or a quadrature component of a complex quantity, as shown in Table 1. In the exemplary designs shown in FIGS. 5 and 8, the $V_1$ signal may comprise the quadrature component of the voltage across series circuit 250, and the $V_2$ signal may comprise the quadrature component of the load voltage or the amplified voltage. In the exemplary designs shown in FIGS. 6 and 9, the $V_X$, $V_Y$ and $V_Z$ signals may each comprise an inphase component or a quadrature component of a complex quantity. The inphase and quadrature components are defined by a peak voltage and a phase. However, the peak voltage and the phase are not measured directly.

Sensors 160a through 160g are thus different from other sensors that measure quantities in polar coordinate, which defines a complex value by a peak value and a phase. This is in contrast to sensors 160a through 160g, which provide quantities in Cartesian coordinate using inphase and quadrature components. Sensor 160 may also be implemented in other manners.

Figure 10A:
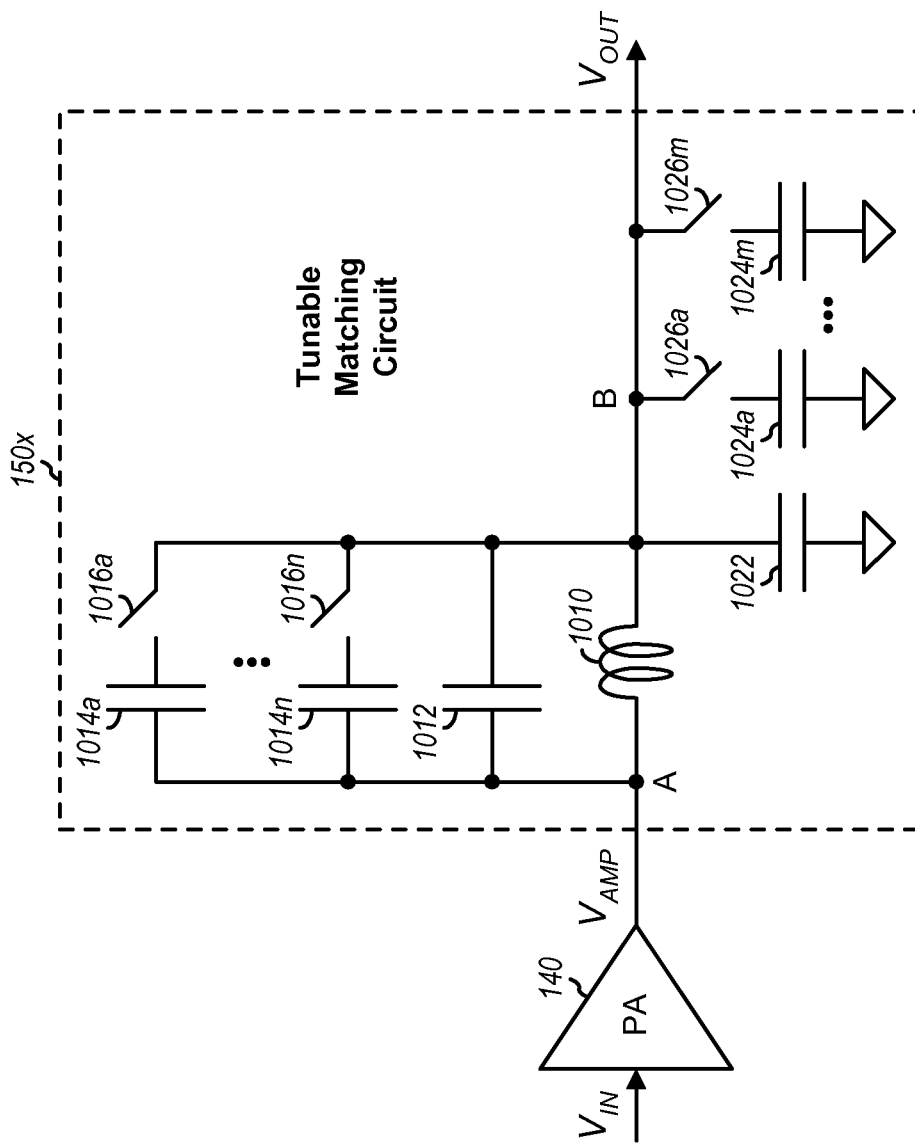
FIGS. 10A and 10B show exemplary designs of tunable matching circuits.

FIG. 10A shows a schematic diagram of a tunable matching circuit 150x, which is an exemplary design of tunable matching circuit 150 in FIG. 1 using switchable capacitors. Within tunable matching circuit 150x, an inductor 1010 and a capacitor 1012 are coupled between input node A and output node B of matching circuit 150x. Capacitor 1012 is a fixed capacitor that is always selected. N switchable capacitors 1014a through 1014n are coupled in series with N switches 1016a through 1016n, respectively, where N may be any integer value. The N series combinations of capacitor 1014 and switch 1016 are coupled between nodes A and B. Each switchable capacitor 1014 may be selected or deselected via the associated switch 1016.

A shunt capacitor 1022 is coupled between node B and circuit ground and is a fixed capacitor that is always selected. M switchable capacitors 1024a through 1024m are coupled in series with M switches 1026a through 1026m, respectively, where M may be any integer value. The M series combinations of capacitor 1024 and switch 1026 are coupled between node B and circuit ground. Each switchable capacitor 1024 may be selected or deselected via the associated switch 1026.

For geometric weighting, capacitors 1014a through 1014n may have progressively greater capacitance (e.g., by a factor of two for binary weighting), and capacitors 1024a through 1024m may also have progressively greater capacitance. For thermometer decoding, capacitors 1014a through 1014n may have the same capacitance, and capacitors 1024a through 1024m may also have the same capacitance. For both types of weighting, capacitors 1014 may be designed to provide the desired range of capacitance for the series path, and capacitors 1024 may be designed to provide the desired range of capacitance for the shunt path. Capacitors 1012 and 1014 provide a variable capacitance of $C_{VAR1}$. Capacitors 1022 and 1024 provide a variable capacitance of $C_{VAR2}$. Different impedance matching settings may be obtained with different combination of values for $C_{VAR1}$ and $C_{VAR2}$.

In general, any number of fixed and switchable capacitors may be used for the series path and also for the shunt path. Furthermore, each fixed or switchable capacitor may have any suitable value. Different impedance matching settings may be obtained with different combinations of switchable capacitors being selected. For example, eight different impedance matching settings ranging from C to 8C may be obtained with eight different switching states for three switchable capacitors 1014 with binary weighting.

Switches 1016 and 1026 may be implemented with metal oxide semiconductor (MOS) transistors or some other semiconductor devices. Multiple MOS transistors may be stacked together for each switch, so that only a fraction of the signal swing appears across each MOS transistor, which may improve reliability.

Inductor 1010 and capacitors 1012 and 1014 may be part of series circuit 250 in FIG. 2. Capacitors 1022 and 1024 may be part of load 260 in FIG. 2. Partitioning tunable matching circuit 150x in this manner may simplify the description above for sensor 160 and computation unit 170.

Figure 10B:
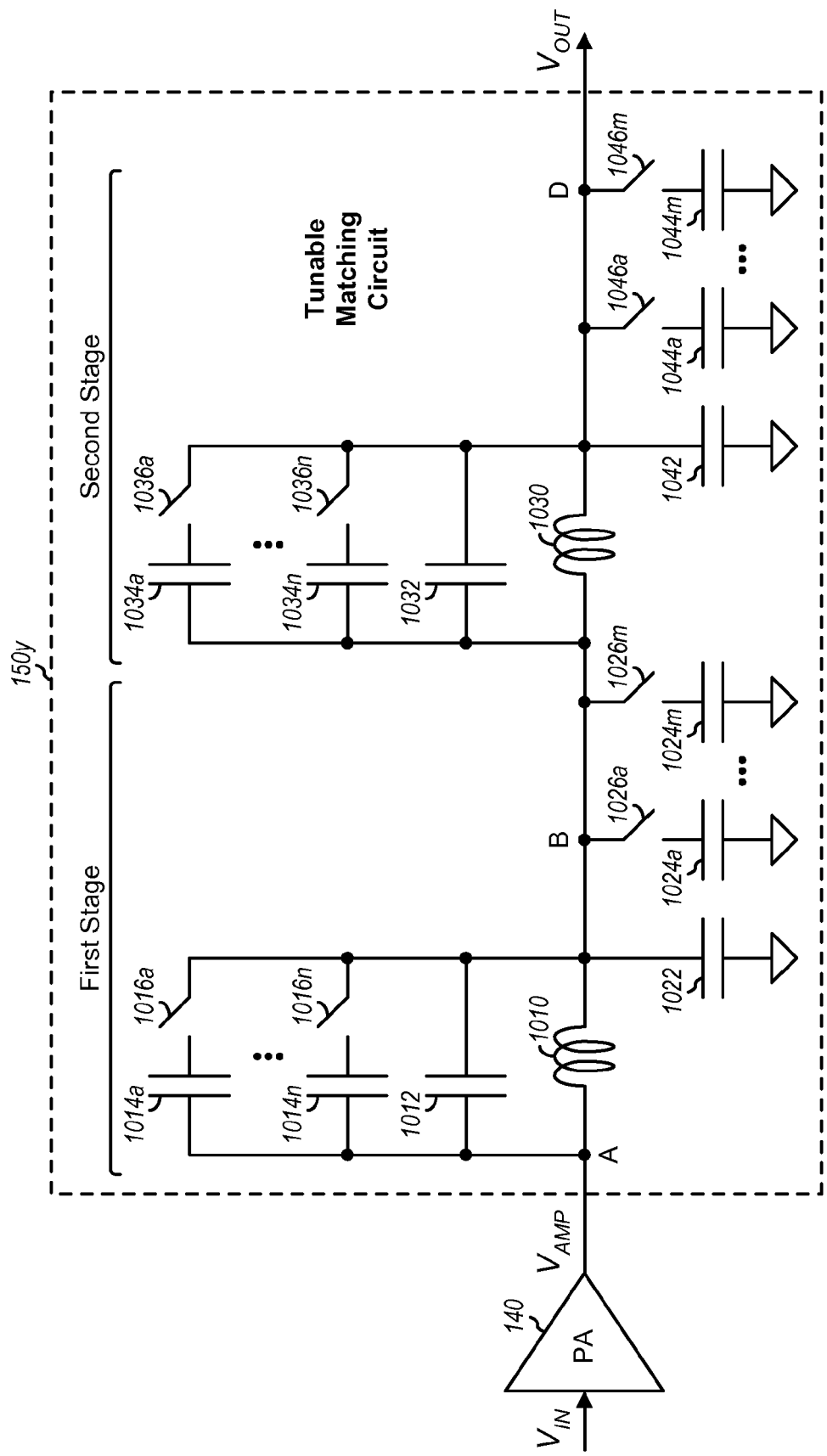

FIG. 10B shows a schematic diagram of a two-stage tunable matching circuit 150y, which is another exemplary design of tunable matching circuit 150 in FIG. 1 using switchable capacitors. Tunable matching circuit 150y includes a first stage comprising inductor 1010, capacitor 1012, capacitors 1014a through 1014n, switches 1016a through 1016n, capacitor 1022, capacitors 1024a through 1024m, and switches 1026a through 1026m, which are coupled as described above for FIG. 10A. Tunable matching circuit 150y further includes a second stage comprising an inductor 1030, a fixed capacitor 1032, N switchable capacitors 1034a through 1034n, N switches 1036a through 1036n, a fixed capacitor 1042, M switchable capacitors 1044a through 1044m, and M switches 1046a through 1046m, which are coupled in similar manner as the inductor, capacitors, and switches in the first stage. In general, the two stages may include the same or different numbers of switchable capacitors in the series path and may include the same or different numbers of switchable capacitors in the shunt path.

Capacitors 1012 and 1014 provide a variable capacitance of $C_{VAR1}$. Capacitors 1022 and 1024 provide a variable capacitance of $C_{VAR2}$. Capacitors 1032 and 1034 provide a variable capacitance of $C_{VAR3}$. Capacitors 1042 and 1044 provide a variable capacitance of $C_{VAR4}$. Different impedance matching settings may be obtained with different combinations of values for $C_{VAR1}$, $C_{VAR2}$, $C_{VAR3}$ and $C_{VAR4}$. Two stages may provide more degree of freedom to tune the impedance matching.

In one design, the voltage at node B may be sensed by sensor 160, e.g., provided to buffer 442, 542 or 642 in FIG. 4, 5 or 6, respectively. In this design, inductor 1010 and capacitors 1012 and 1014 may be part of series circuit 250 in FIG. 2, and the remaining inductor and capacitors may be part of load 260 in FIG. 2. In another design, the voltage at node D may be sensed by sensor 160. In this design, inductors 1010 and 1030 and capacitors 1012, 1014, 1022, 1024, 1032 and 1034 may be part of series circuit 250 in FIG. 2, and the remaining capacitors 1042 and 1044 may be part of load 260 in FIG. 2.

FIGS. 10A and 10B show two exemplary designs of tunable matching circuit 150 that may be used for impedance matching. Tunable matching circuit 150 may also be implemented in other manners, e.g., with other circuit topologies, with more stages, etc. For example, one or more shunt capacitors may be coupled between input node A and circuit ground. As another example, series capacitors 1012 and 1014 may be omitted in tunable matching circuit 150x in FIG. 10A.

Figure 10C:
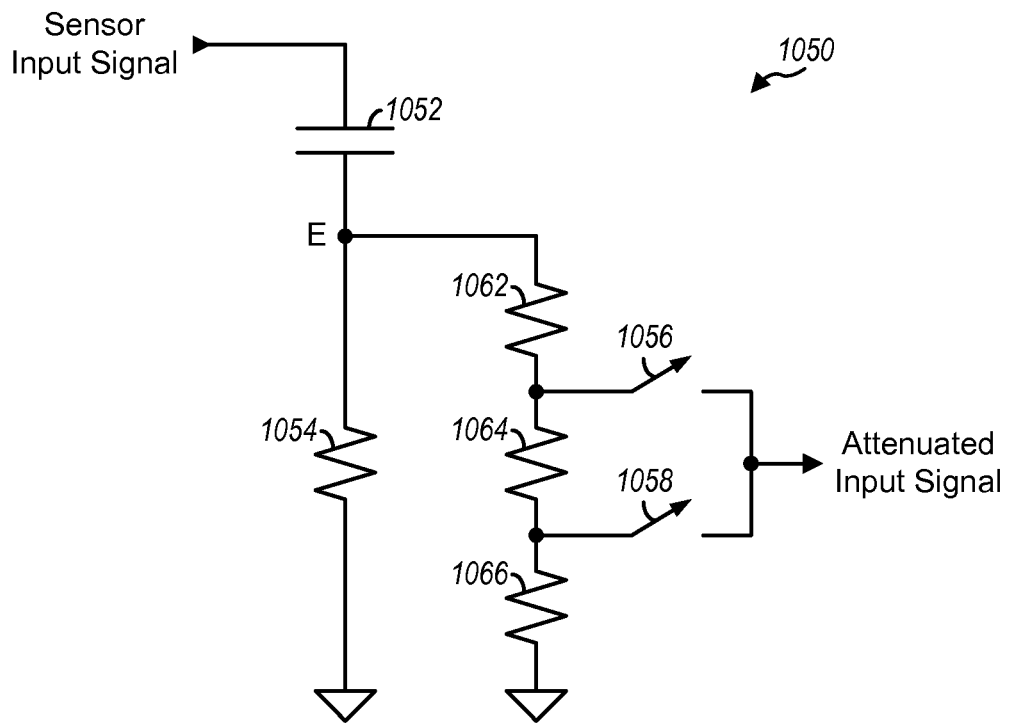
FIGS. 10C and 10D show two exemplary designs of a programmable attenuator.

FIG. 10C shows a schematic diagram of an exemplary design of a programmable attenuator 1050, which may be used for each of the programmable attenuators show in FIGS. 3 through 9. Programmable attenuator 1050 receives a sensor input signal, which may be the amplified RF signal from power amplifier 140 or the output RF signal at the load, and provides an attenuated input signal. Within programmable attenuator 1050, a capacitor 1052 has one end receiving the sensor input signal and the other end coupled to node E. A resistor 1054 is coupled between node E and circuit ground. Resistors 1062, 1064 and 1066 are coupled in series, and the combination is coupled between node E and circuit ground. Switches 1056 and 1058 have their right ends coupled together and their left ends coupled to the two ends of resistor 1064. The connected right ends of switches 1056 and 1058 provide the attenuated input signal.

Capacitor 1052 provides AC coupling. Switch 1058 may be selected/closed to provide a smaller attenuated input signal, and switch 1056 may be selected/closed to provide a larger attenuated input signal. More than two signal levels may also be obtained with (i) more resistors coupled in series and between node E and circuit ground and (ii) more switches coupled to these resistors to select one of the signals at the resistors.

Figure 10D:
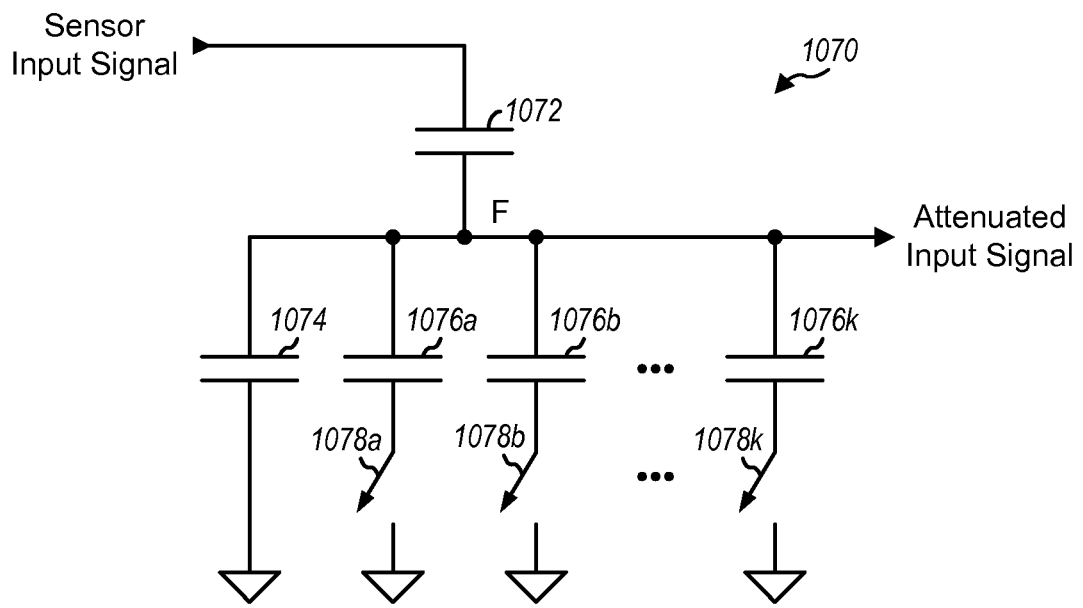

FIG. 10D shows a schematic diagram of an exemplary design of a programmable attenuator 1070, which may also be used for each of the programmable attenuators show in FIGS. 3 through 9. Programmable attenuator 1070 receives a sensor input signal and provides an attenuated input signal. Within programmable attenuator 1070, a capacitor 1072 has one end receiving the sensor input signal and the other end coupled to node F. A capacitor 1074 is coupled between node F and circuit ground. K resistors 1076a through 1076k are coupled in series with K switches 1078a through 1078k, respectively, where K may be any integer value. The K combinations of capacitors 1076 and switches 1078 are coupled between node F and circuit ground. Node F provides the attenuated input signal.

Capacitor 1072 provides AC coupling and forms the top part of a capacitive divider. Capacitors 1074 and 1076 form the bottom part of the capacitive divider. Different divider ratios, and hence different signal levels for the attenuated input signal, may be obtained by selecting different combinations of capacitors 1076a through 1076k.

FIGS. 10C and 10D show two exemplary designs of a programmable attenuator. A programmable attenuator may also be implemented in other manners, e.g., with other circuit topologies.

Figure 11:
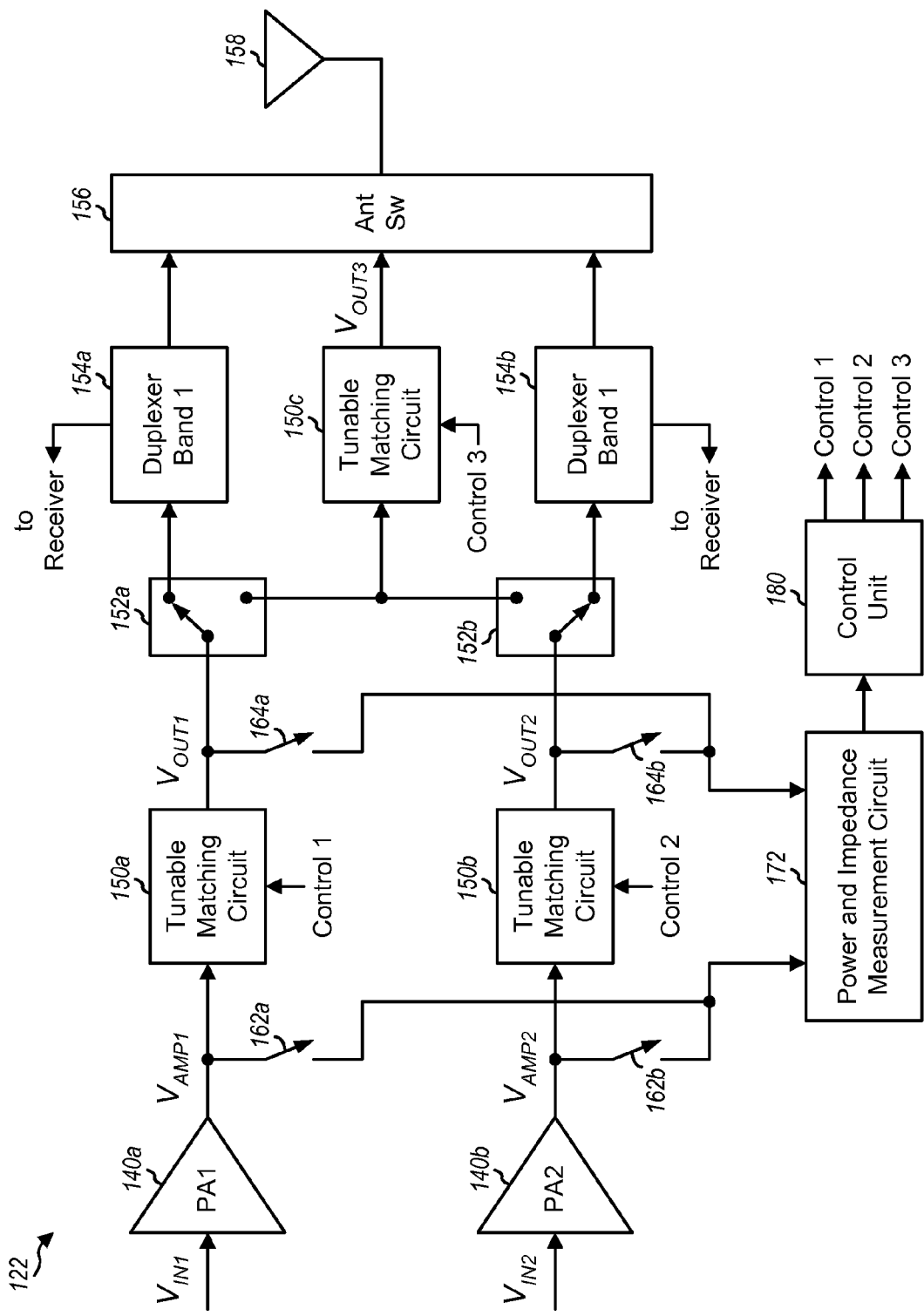
FIGS. 11 and 12 show two more exemplary designs of a transmitter.

FIG. 11 shows a block diagram of an exemplary design of a transmitter 122 supporting multiple modes and multiple bands. Within transmitter 122, a first power amplifier 140a amplifies a first input RF signal, $V_{IN1}$, and provides a first amplified RF signal, $V_{AMP1}$. A tunable matching circuit 150a is coupled to the output of power amplifier 140a, performs output impedance matching and filtering for power amplifier 140a, and provides a first output RF signal, $V_{OUT1}$, to a switch 152a. Switch 152a provides the $V_{OUT1}$ signal to either a duplexer 154a or a tunable matching circuit 150c. Duplexer 154a routes the $V_{OUT1}$ signal to a first input of an antenna switch 156 and also routes a received RF signal from antenna switch 156 to a receiver for band 1 (not shown in FIG. 11).

A second power amplifier 140b amplifies a second input RF signal, $V_{IN2}$, and provides a second amplified RF signal, $V_{AMP2}$. A tunable matching circuit 150b is coupled to the output of power amplifier 140b, performs output impedance matching and filtering for power amplifier 140b, and provides a second output RF signal, $V_{OUT2}$, to a switch 152b. Switch 152b provides the $V_{OUT2}$ signal to either a duplexer 154b or tunable matching circuit 150c. Duplexer 154b routes the $V_{OUT2}$ signal to a second input of antenna switch 156 and also routes a received RF signal from antenna switch 156 to a receiver for band 2 (not shown in FIG. 11). Tunable matching circuit 150c combines the $V_{OUT1}$ and $V_{OUT2}$ signals, performs impedance matching and filtering for power amplifiers 140a and 140b when their output signals are combined, and provides a third output RF signal, $V_{OUT3}$, to a third input of antenna switch 156. Switch 156 couples one of the three inputs to an output, which is coupled to antenna 158. Each tunable matching circuit 150 may be implemented with tunable matching circuit 150x in FIG. 10A, tunable matching circuit 150y in FIG. 10B, or some other tunable matching circuit.

Transmitter 122 may support a number of modes. In a first mode, power amplifier 140a may be enabled, and power amplifier 140b may be disabled. The $V_{IN1}$ signal may be amplified by power amplifier 140a and routed through tunable matching circuit 150a, switch 152a, duplexer 154a, and switch 156 to antenna 158. In a second mode, power amplifier 140b may be enabled, and power amplifier 140a may be disabled. The $V_{IN2}$ signal may be amplified by power amplifier 140b and routed through tunable matching circuit 150b, switch 152b, duplexer 154b, and switch 156 to antenna 158. In a third mode, power amplifiers 140a and 140b may both be enabled. A common input RF signal may be amplified to obtain the $V_{IN1}$ and $V_{IN2}$ signals, which may be amplified by power amplifiers 140a and 140b and routed through tunable matching circuits 150a and 150b, and combined by tunable matching circuit 150c. The $V_{OUT3}$ signal from tunable matching circuit 150c may be routed through switch 156 to antenna 158. The first mode may support Code Division Multiple Access (CDMA) 1x and/or Wideband CDMA (WCDMA) for the first band, e.g., cellular band or PCS band. The second mode may support CDMA 1x and/or WCDMA for the second band, e.g., GSM 900 or IMT-2000 band. The third mode may support Global System for Mobile Communications (GSM) for both bands.

Switches 162a and 162b may couple the outputs of power amplifiers 140a and 140b, respectively, to a first input of measurement circuit 172. Switches 164a and 164b may couple the outputs of tunable matching circuits 150a and 150b, respectively, to a second input of measurement circuit 172. Measurement circuit 172 may make various measurements that may be used to determine the load impedance, the output power, and/or other parameters at the output of tunable matching circuit 150a when switches 162a and 164a are closed and switches 162b and 164b are opened. Measurement circuit 172 may make various measurements that may be used to determine the load impedance, the output power, and/or other parameters at the output of tunable matching circuit 150b when switches 162a and 164a are opened and switches 162b and 164b are closed. The load impedance, the output power, and/or other parameters may be used to generate Controls 1, 2 and 3 to adjust tunable matching circuits 150a, 150b and 150c, respectively.

Figure 12:
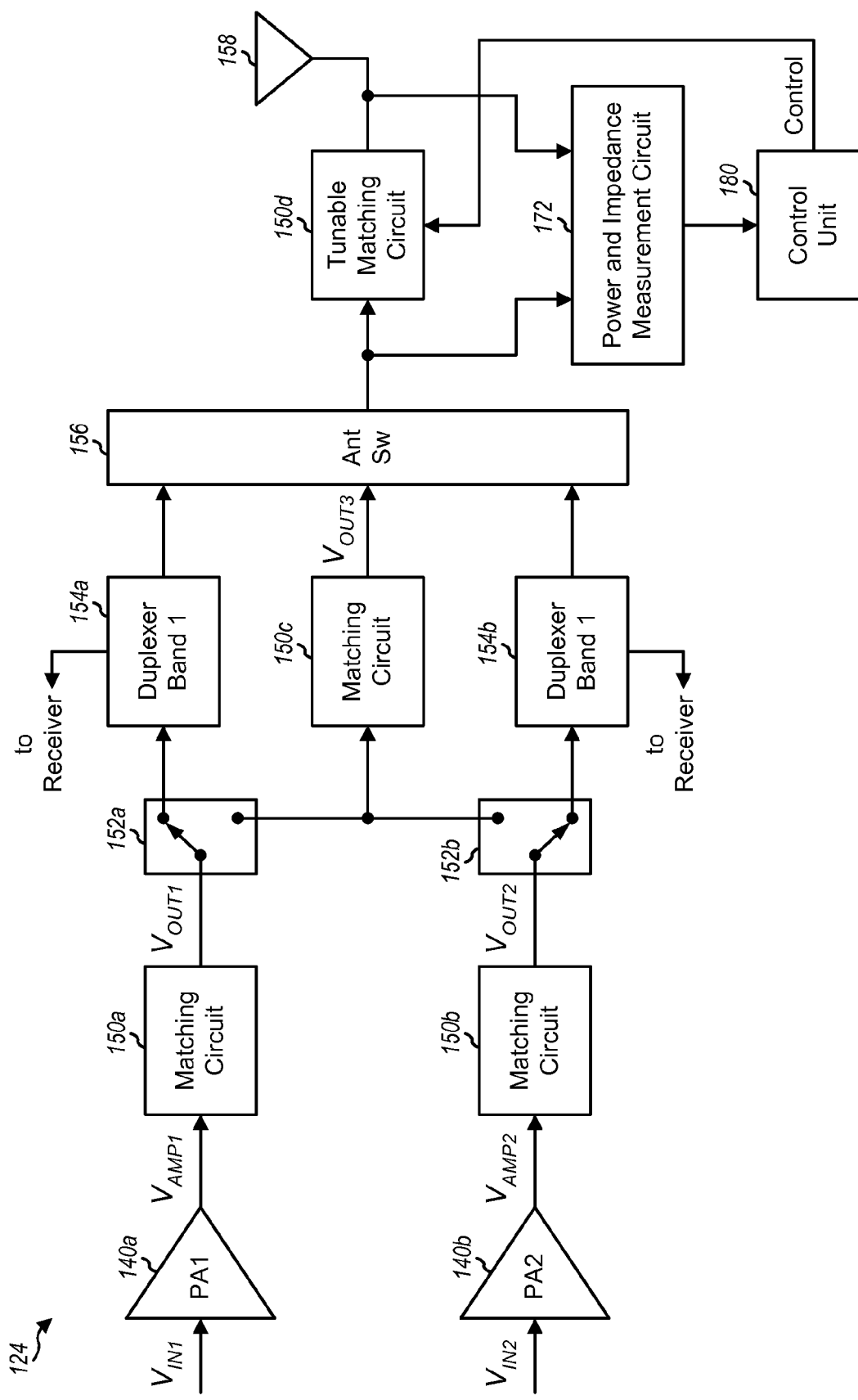

FIG. 12 shows a block diagram of an exemplary design of a transmitter 124 supporting multiple modes and multiple bands. Transmitter 124 includes power amplifiers 140a and 140b, matching circuits 150a, 150b and 150c, switches 152a and 152b, duplexers 154a and 154b, and antenna switch 156, which are coupled as described above for FIG. 11. Transmitter 124 further includes a tunable matching circuit 150d coupled between the output of antenna switch 156 and antenna 158. Measurement circuit 172 may make various measurements that may be used to determine the load impedance, the output power, and/or other parameters at the output of tunable matching circuit 150d. The load impedance, the output power, and/or other parameters may be used to adjust tunable matching circuit 150d.

Transmitters 122 and 124 may operate in low band (e.g., below 1 gigahertz (GHz)) or high band (e.g., near 2 GHz). A transmitter may support operation in both low band and high band. The transmitter may include a first set of power amplifiers, tunable matching circuits, switches, and duplexers for low band and a second set of power amplifiers, tunable matching circuits, switches, and duplexers for high band. An antenna switch may couple to the duplexers and tunable matching circuits for both low band and high band. The output of the antenna switch may be coupled to the antenna or to tunable matching circuit 150d. A pair of switches 162 and 164 may couple each transmit signal path to measurement circuit 172, e.g., as shown in FIG. 11.

In general, a transmitter may include any number of power amplifiers and any number of tunable matching circuits. The power amplifiers may have the same or different gains and the same or different maximum output power levels. The transmitter may also support any number of modes and any number of bands. Measurement circuit 172 may make measurements at any point within the transmitter. The measurements may be used to determine the load impedance, the output power, and/or other parameters that may be used to adjust one or more tunable matching circuits.

Adaptive load matching to dynamically adjust a tunable matching circuit may be achieved in various manners. In one exemplary design, the load impedance $Z_L$ may be measured, e.g., with sensor 160b in FIG. 4, sensor 160c in FIG. 5, sensor 160d in FIG. 6, etc. The measured load impedance may be provided to a look-up table, which may store different settings of the tunable matching circuit for different load impedances. An appropriate setting may be obtained from the look-up table for the measured load impedance and applied to the tunable matching circuit. In another exemplary design, the tunable matching circuit may be varied by selecting different settings. The power delivered to the load may be measured (e.g., with sensor 160a, 160b, 160c, 160d, etc.) for each setting of the tunable matching circuit. The setting that maximizes the delivered power to the load may be selected for the tunable matching circuit.

In another exemplary design, adaptive load matching may be performed as follows. The power $P_L$ delivered to the load and the load impedance $Z_L$ may be measured as described above. A reflection coefficient ρ may be computed based on the load impedance, as follows:

$$\rho = \frac{Z_L - Z_O}{Z_L + Z_O}, \quad \text{Eq (62)}$$

where $Z_O$ may be 50 Ohms or some other value.

A voltage standing wave ratio (VSWR) may be computed based on the reflection coefficient, as follows:

$$VSWR = \frac{1+\rho}{1-\rho}. \quad \text{Eq (63)}$$

VSWR is a ratio of the maximum voltage to the minimum voltage of a signal. VSWR may be used to protect power amplifier 140 from excessively large output voltage.

The load power may be referred to as radiated power and may be expressed as:

$$P_L = P_{RADIATED} = P_{INCIDENT} - P_{REFLECTED}, \quad \text{Eq (64)}$$

where $P_{RADIATED}$ is the power radiated by antenna 158,
$P_{INCIDENT}$ is the power provided by power amplifier 140, and
$P_{REFLECTED}$ is the reflected power due to mismatch at the load.

The incident power, the radiated power, and the reflected power may be expressed as:

$$P_{INCIDENT} = P_{RADIATED} + P_{REFLECTED}, \quad \text{Eq (65)}$$

$$P_{RADIATED} = (1-|\rho|^2) \cdot P_{INCIDENT}, \text{ and} \quad \text{Eq (66)}$$

$$P_{REFLECTED} = |\rho|^2 \cdot P_{INCIDENT}. \quad \text{Eq (67)}$$

A mismatch loss may be computed as follows:

$$\text{Mismatch loss} = 10 \cdot \log_{10}(1-\rho^2). \quad \text{Eq (68)}$$

FIG. 13 shows an exemplary design of a process 1300 for performing adaptive load matching. The load impedance and load power may be measured, e.g., as described above (block 1312). VSWR may be computed based on the measured load impedance, e.g., as shown in equations (62) and (63) (block 1314). If the VSWR is larger than a threshold value, as determined in block 1316, then a tunable matching circuit may be adjusted (block 1318). Otherwise, the tunable matching circuit may be retained. The process may be repeated periodically or whenever a trigger condition is encountered.

In an exemplary design, an apparatus may comprise a sensor and a computation unit, e.g., as shown in FIG. 3. The sensor may sense a first voltage signal (e.g., $V_{IND}$) across first and second ends of a series circuit coupled to a load to obtain a first sensed signal (e.g., $V_{S1}$). The sensor may also sense a second voltage signal (e.g., $V_{AMP}$ or $V_{LOAD}$) at the second end of the series circuit to obtain a second sensed signal (e.g., $V_{S2}$). The sensor may provide a sensor output generated based on the first and second sensed signals. The series circuit may comprise an inductor coupled between the two ends of the series circuit and/or other circuit elements. The computation unit may determine the power delivered to the load based on the sensor output. For example, the computation unit may scale the sensor output based on the impedance of the series circuit to obtain the power delivered to the load.

In an exemplary design, the sensor may include first and second programmable attenuators, an amplifier, a buffer, a phase shifter, a multiplier, and a lowpass filter, e.g., as shown in FIG. 3. The first programmable attenuator may be coupled to the first end of the series circuit and may provide a first input signal. The second programmable attenuator may be coupled to the second end of the series circuit and may provide a second input signal. The amplifier may receive the first and second input signals and provide the first sensed signal. The buffer may receive the second input signal and provide the second sensed signal. The second end of the series circuit may be coupled to a power amplifier (as shown in FIG. 3) or to the load (not shown in FIG. 3). The phase shifter may be coupled to the buffer and may provide a phase-shifted signal. The multiplier may multiply the first sensed signal with the phase-shifted signal and may provide a multiplier output. The lowpass filter may filter the multiplier output and providing the sensor output. The sensor may also include different and/or additional circuits.

The apparatus may further include a tunable matching circuit coupled to the power amplifier. The tunable matching circuit may comprise the series circuit and may be adjusted based on the power delivered to the load.

In another exemplary design, an apparatus may comprise a sensor and a computation unit, e.g., as shown in any of FIGS. 4 through 9. The sensor may sense a first voltage signal (e.g., $V_{IND}$) across first and second ends of a series circuit coupled to a load to obtain a first sensed signal. The sensor may also sense a second voltage signal (e.g., $V_{AMP}$ or $V_{LOAD}$) at the second end of the series circuit to obtain a second sensed signal. The sensor may mix a first version of the first sensed signal with a first version of the second sensed signal to obtain a first sensor output. The sensor may also mix a second version of the first sensed signal with a second version of the second sensed signal to obtain a second sensor output. The sensor may also mix one or more versions of the first sensed signal with one or more versions of the second sensed signal to obtain one or more additional sensor outputs. In general, the sensor may provide any number of sensor outputs for any number of cross-mixing products between the first and second sensed signals. The computation unit may determine the impedance and/or the delivered power at the second end of the series circuit based on the sensor outputs.

In an exemplary design, the second end of the series circuit may be coupled to the load, e.g., as shown in FIGS. 4 to 6. The sensor may sense the second voltage signal at the load. The computation unit may determine the impedance and/or the delivered power at the load. In another exemplary design, the second end of the series circuit may be coupled to a power amplifier. The sensor may sense the second voltage signal at the output of the power amplifier. The computation unit may determine the impedance and/or the delivered power at the output of the power amplifier.

In an exemplary design, the first version of the first sensed signal may be the first sensed signal, and the second version of the second sensed signal may be the second sensed signal. The second version of the first sensed signal may be a limited version, or a phase shifted version, or a limited and phase shifted version of the first sensed signal. The first version of the second sensed signal may be a limited version, or a phase shifted version, or a limited and phase shifted version of the second sensed signal. The various versions of the first and second sensed signals may be obtained with limiters, phase shifters, etc. The computation unit may determine the impedance and/or the delivered power in different manners (e.g., based on different equations and/or measurements) depending on how the different versions of the first and second sensed signals are defined.

In an exemplary design, the first sensor output may be indicative of inphase or quadrature component of the first voltage signal. The second sensor output may be indicative of inphase or quadrature component of the second voltage signal. The first or second sensor output may also be indicative of the phase of the impedance.

In an exemplary design, the sensor may include first and second programmable attenuators, an amplifier, and a buffer. The first programmable attenuator may be coupled to the first end of the series circuit and may provide a first input signal. The second programmable attenuator may be coupled to the second end of the series circuit and may provide a second input signal. The amplifier may receive the first and second input signals and provide the first sensed signal. The buffer may receive the second input signal and provide the second sensed signal.

In an exemplary design, the sensor may further include first and second switches, a mixer, and a lowpass filter, e.g., as shown in FIG. 4. The first switch may provide one of multiple versions of the first sensed signal including the first and second versions of the first sensed signal. The second switch may provide one of multiple versions of the second sensed signal including the first and second versions of the second sensed signal. The mixer may mix the version of the first sensed signal from the first switch with the version of the second sensed signal from the second switch. The lowpass filter may filter the mixer output and provide a sensor output. In general, the sensor may provide any number of sensor outputs. Different sensor outputs may be obtained by mixing different versions of the first and second sensed signals.

In another exemplary design, the sensor may further include first and second mixers and first and second lowpass filters, e.g., as shown in FIG. 5. The first mixer may mix the first version of the first sensed signal with the first version of the second sensed signal and provide a first mixer output. The second mixer may mix the second version of the first sensed signal with the second version of the second sensed signal and provide a second mixer output. The first and second lowpass filters may filter the first and second mixer outputs and provide the first and second sensor outputs, respectively.

In another exemplary design, the sensor may further include a third mixer and a third lowpass filter, e.g., as shown in FIG. 6. The third mixer may mix a third version of the first sensed signal with a third version of the second sensed signal and provide a third mixer output. The third lowpass filter may filter the third mixer output and provide a third sensor output. The computation unit may determine the impedance and/or the delivered power based further on the third sensor output. A single lowpass filter may also be shared by all mixers.

In an exemplary design, the load may comprise a reactive element coupled in series with a switch and to the second end of the series circuit, e.g., as shown in FIG. 5. The computation unit may obtain (i) a first measurement of the first and second sensor outputs with the switch closed and (ii) a second measurement of the first and second sensor outputs with the switch opened. The computation unit may then determine the impedance and/or the delivered power based on the first and second measurements.

The apparatus may further include a power amplifier coupled to a tunable matching circuit. The tunable matching circuit may comprise the series circuit and may be adjusted based on the impedance and/or the delivered power.

In another exemplary design, a wireless device may include a first power amplifier (e.g., power amplifier 140a in FIG. 11), a first tunable matching circuit (e.g., tunable matching circuit 150a), and a measurement circuit. The first power amplifier may amplify a first input RF signal and provide a first amplified RF signal. The first tunable matching circuit may provide output impedance matching and filtering for the first power amplifier, may receive the first amplified RF signal, and may provide a first output RF signal. The measurement circuit may measure first impedance and/or delivered power at the output of the first tunable matching circuit, which may be adjusted based on the measured first impedance or delivered power.

The wireless device may further include a second power amplifier (e.g., power amplifier 140b) and a second tunable matching circuit (e.g., tunable matching circuit 150b). The second power amplifier may amplify a second input RF signal and provide a second amplified RF signal. The second tunable matching circuit may provide output impedance matching and filtering for the second power amplifier, may receive the second amplified RF signal, and may provide a second output RF signal. The measurement circuit may further measure second impedance and/or delivered power at the output of the second tunable matching circuit, which may be adjusted based on the measured second impedance or delivered power. The wireless device may further include a third tunable matching circuit (e.g., tunable matching circuit 150c) coupled to the first and second tunable matching circuits. The third tunable matching circuit may receive and combine the first and second amplified RF signals and provide a third output RF signal. The measurement circuit further may measure third impedance and/or delivered power at the output of the third tunable matching circuit, which may be adjusted based on the measured third impedance or delivered power.

FIG. 14 shows an exemplary design of a process 1400 for measuring impedance and/or power. A first voltage signal across first and second ends of a series circuit coupled to a load may be sensed to obtain a first sensed signal (block 1412). A second voltage signal at the second end of the series circuit may be sensed to obtain a second sensed signal (block 1414). A first version of the first sensed signal may be mixed with a first version of the second sensed signal to obtain a first sensor output (block 1416). A second version of the first sensed signal may be mixed with a second version of the second sensed signal to obtain a second sensor output (block 1418). One or more additional sensor outputs may be obtained by mixing one or more versions of the first or second sensed signal with one or more versions of the first or second sensed signal, as described above. The different versions of each sensed signal may be generated as described above. The impedance and/or delivered power at the second end of the series circuit may be determined based on the first and second sensor outputs and possibly one or more additional sensor outputs (block 1420). A tunable matching circuit comprising the series circuit may be adjusted based on the impedance and/or delivered power at the second end of the series circuit (block 1422). In an exemplary design of block 1422, VSWR may be determined based on the measured impedance, and the tunable matching circuit may be adjusted based on the VSWR. The tunable matching circuit may also be adjusted in other manners.

The power and impedance measurement circuits described herein may enable adaptive load matching for a power amplifier and may provide various advantages, such as:

Provide both magnitude and phase of the load,
Provide incident, reflected, and delivered power to the load,
Provide impedance matching for the power amplifier under mismatch by measuring voltages and computing the impedance and/or power of the load,
Enable adjustment of a tunable impedance matching based on the measured impedance and/or power,
Improve total radiated power (TRP) by detecting the power delivered to the load,
Improve efficiency of the power amplifier,
Reduce power dissipation and improve power efficiency over IC process, battery voltage, and temperature by changing the load line of the power amplifier,
Protect the power amplifier under mismatch,
Reduce impedance mismatch even in normal operating conditions,
Avoid the need for directional couplers to sense the output power, and
Suitable for implementation on a CMOS IC.

Power and/or impedance measurements may be used to adjust a tunable matching circuit, as described above. The power and/or impedance measurements may also be used for other purposes. For example, the power measurements may be used to adjust the transmit power of a wireless device for power control, to sense overload conditions and reduce the gain and/or transmit power of the power amplifier, etc.

The power and impedance measurement circuits described herein may be used for a transmitter in a wireless device, as described above. The power and impedance measurement circuits may also be used in other electronics devices to measure power and/or impedance. In FIG. 2, power amplifier 140 may be replaced with any signal source, matching circuit 150 may be replaced with any circuit having a reactive element in the signal path to the load, and load 260 may be any load to which power can be delivered.

The power and impedance measurement circuits described herein may be implemented on an IC, an analog IC, an RFIC, a mixed-signal IC, an ASIC, a printed circuit board (PCB), an electronics device, etc. The measurement circuits may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), etc.

An apparatus implementing the measurement circuits described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
a sensor coupled to each of first and second ends of a circuit coupled to a load and configured to measure a voltage drop across the circuit to obtain a first sensed signal, to sense a second voltage signal at the second end of the circuit to obtain a second sensed signal, and to provide a sensor output generated based at least in part on multiplying the first and second sensed signals; and
a computation unit coupled to the sensor and to compute power observed at the load based on the sensor output.

2. The apparatus of claim 1, the sensor comprising
an amplifier to receive first and second input signals obtained from the first and second ends, respectively, of the circuit and provide the first sensed signal, and
a multiplier coupled to the amplifier and to multiply the first sensed signal with a version of the second sensed signal and provide a multiplier output.

3. The apparatus of claim 2, the sensor further comprising
a buffer to receive the second input signal and provide the second sensed signal, and
a phase shifter coupled to the buffer and to provide a phase-shifted version of the second sensed signal to the multiplier.

4. The apparatus of claim 2, the sensor further comprising
a lowpass filter coupled to the multiplier and to filter the multiplier output and provide the sensor output.

5. The apparatus of claim 2, the sensor further comprising
a first programmable attenuator coupled to the first end of the circuit and to provide the first input signal, and
a second programmable attenuator coupled to the second end of the circuit and to provide the second input signal.

6. The apparatus of claim 1, the sensor comprising
an amplifier to receive first and second input signals obtained from the first and second ends, respectively, of the circuit and provide the first sensed signal,
a buffer to receive the second input signal and provide the second sensed signal,
a phase shifter coupled to the buffer and to provide a phase-shifted signal,
a multiplier coupled to the amplifier and the phase shifter and to multiply the first sensed signal with the phase-shifted signal and provide a multiplier output, and
a lowpass filter coupled to the multiplier and to filter the multiplier output and provide the sensor output.

7. The apparatus of claim 1, the computation unit to scale the sensor output based on impedance of the circuit and provide the power delivered to the load.

8. The apparatus of claim 1, the circuit comprising an inductor coupled between the first and second ends of the circuit.

9. The apparatus of claim 1, further comprising:
a tunable matching circuit comprising the circuit; and
a power amplifier coupled to the tunable matching circuit, the tunable matching circuit being adjusted based on the power delivered to the load.

10. A method comprising:
measuring a voltage drop across first and second ends of a circuit coupled to a load to obtain a first sensed signal;
sensing a second voltage signal at the second end of the circuit to obtain a second sensed signal;
generating a sensor output based at least in part on multiplying the first and second sensed signals; and
computing power observed at the load based on the sensor output.

11. The method of claim 10, further comprising:
adjusting a matching circuit comprising the circuit based on the power delivered to the load.

12. An apparatus comprising:
means for measuring a voltage drop across first and second ends of a circuit coupled to a load to obtain a first sensed signal;
means for sensing a second voltage signal at the second end of the circuit to obtain a second sensed signal;
means for generating a sensor output based at least in part on multiplying the first and second sensed signals; and
means for computing power observed at the load based on the sensor output.

13. A wireless device comprising:
a first power amplifier to amplify a first input radio frequency (RF) signal and provide a first amplified RF signal;
a first tunable matching circuit coupled to the first power amplifier and to provide output impedance matching for the first power amplifier, to receive the first amplified RF signal, and to provide a first output RF signal; and
a computation circuit coupled in parallel to the first tunable matching circuit and to compute first impedance or observed power at output of the first tunable matching circuit, the first tunable matching circuit being adjusted based on the measured first impedance or observed power.

* * * * *